(12) United States Patent
Kodenkandath et al.

(10) Patent No.: US 7,781,376 B2
(45) Date of Patent: Aug. 24, 2010

(54) HIGH TEMPERATURE SUPERCONDUCTING WIRES AND COILS

(75) Inventors: Thomas Kodenkandath, N. Grafton, MA (US); Wei Zhang, Shrewsbury, MA (US); Yibing Huang, Northborough, MA (US); Xiaoping Li, Westborough, MA (US); Edward J. Siegal, Malden, MA (US); Martin W. Rupich, Framingham, MA (US)

(73) Assignee: American Superconductor Corporation, Devens, MA (US)

( * ) Notice: Subject to any disclaimer, the term of this patent is extended or adjusted under 35 U.S.C. 154(b) by 1000 days.

(21) Appl. No.: 11/494,993

(22) Filed: Jul. 28, 2006

(65) Prior Publication Data

US 2007/0111893 A1    May 17, 2007

Related U.S. Application Data

(60) Provisional application No. 60/703,815, filed on Jul. 29, 2005.

(51) Int. Cl.
*H01B 12/00* (2006.01)
*H01L 39/00* (2006.01)
*H01F 6/00* (2006.01)

(52) U.S. Cl. .............. 505/235; 505/230; 505/234; 505/238; 505/704; 505/705; 174/125.1; 29/599; 335/216

(58) Field of Classification Search .......... None
See application file for complete search history.

(56) References Cited

U.S. PATENT DOCUMENTS

| 5,047,389 A | 9/1991 | Woolf et al. |
| 5,525,583 A | 6/1996 | Aized et al. |
| 5,914,647 A | 6/1999 | Aized et al. |
| 5,987,342 A | 11/1999 | Scudiere et al. |
| 6,096,565 A | 8/2000 | Goland et al. |
| 6,436,317 B1 | 8/2002 | Malozemoff et al. |
| 6,444,917 B1 | 9/2002 | Scudiere et al. |
| 6,522,236 B1 | 2/2003 | Ries et al. |

(Continued)

FOREIGN PATENT DOCUMENTS

JP    2003-206134    7/2003

OTHER PUBLICATIONS

U.S. Appl. No. 09/615,999.

(Continued)

*Primary Examiner*—Stanley Silverman
*Assistant Examiner*—Kallambella Vijayakumar
(74) *Attorney, Agent, or Firm*—Occhiuti Rohlicek & Tsao LLP

(57) ABSTRACT

A superconducting wire includes first and second superconducting layers disposed on one or more substrates in stacked relationship, the first superconducting layer comprising a high temperature superconducting oxide of a first composition and the second superconducting layer comprising a high temperature superconducting layer of a second composition, wherein the first and second compositions are different. The first superconductor layer optionally includes a high temperature superconductor composition selected to provide enhanced critical current (Ic(c)) in the presence of magnetic fields perpendicular to surface of the superconducting layer (H//c). The second superconductor layer optionally includes a high temperature superconductor composition selected to provide enhanced critical current (Ic) in the presence of magnetic fields parallel to surface of the superconducting layer (H//ab).

30 Claims, 13 Drawing Sheets

U.S. PATENT DOCUMENTS

| | | |
|---|---|---|
| 6,624,122 B1 | 9/2003 | Holesinger et al. |
| 6,657,533 B2 | 12/2003 | Snitchler et al. |
| 6,690,957 B2 | 2/2004 | Akasegawa et al. |
| 6,716,545 B1 | 4/2004 | Holesinger et al. |
| 6,730,410 B1 | 5/2004 | Fritzemeier et al. |
| 6,745,059 B2 | 6/2004 | Buczek et al. |
| 6,765,151 B2 | 7/2004 | Fritzemeier et al. |
| 6,784,362 B1 | 8/2004 | Buczek et al. |
| 6,797,313 B2 | 9/2004 | Fritzemeier et al. |
| 6,828,507 B1 | 12/2004 | Fritzemeier et al. |
| 6,974,501 B1 | 12/2005 | Zhang et al. |
| 2001/0056041 A1* | 12/2001 | Jia et al. ............ 505/100 |
| 2002/0144838 A1* | 10/2002 | Fritzemeier et al. ...... 174/125.1 |
| 2004/0192559 A1 | 9/2004 | Araki et al. |
| 2004/0266628 A1 | 12/2004 | Lee et al. |
| 2005/0007227 A1* | 1/2005 | Lee et al. ............ 335/216 |
| 2005/0065035 A1 | 3/2005 | Rupich et al. |
| 2005/0159298 A1* | 7/2005 | Rupich et al. ............ 502/100 |
| 2006/0040830 A1 | 2/2006 | Thieme et al. |
| 2006/0073975 A1 | 4/2006 | Thieme et al. |
| 2006/0073979 A1 | 4/2006 | Thieme et al. |
| 2006/0094603 A1 | 5/2006 | Li et al. |

OTHER PUBLICATIONS

U.S. Appl. No. 10/758,710.
U.S. Appl. No. 10/858,309.
U.S. Appl. No. 10/955,801, Thieme et al.
U.S. Appl. No. 10/955,875, Thieme et al.
U.S. Appl. No. 11/193,262.
U.S. Appl. No. 11/394,917.
U.S. Appl. No. 11/490,779.
U.S. Appl. No. 11/494,993, filed Jul. 28, 2006, Kodenkandath et al.
U.S. Appl. No. 60/615,289, filed Oct. 1, 2004, Li et al.
U.S. Appl. No. 60/677,001, filed Mar. 31, 2005, Thieme.
U.S. Appl. No. 60/703,836, Li.
U.S. Appl. No. 60/832,716.
U.S. Appl. No. 60/832,724.
U.S. Appl. No. 60/832,871.
Liu et al. Wetting Reaction of Sn-Ag Based Solder Systems on Cu Substrates Plated with Au and/or Pd layer. Journal of Electronic Materials, vol. 30 No. 5 2001 abstract.
PCT, International Search Report Oct. 17, 2007.
Alexis P. Malozemoff, "Second Generation HTS Wire: An Assessment," American Superconductor Corporation White Paper, Dec. 2004, 15 pages.

* cited by examiner

HIGH TEMPERATURE SUPERCONDUCTING WIRES AND COILS

RELATED APPLICATIONS

This application claims the benefit under 35 U.S.C. §119 (e) of U.S. Provisional Patent Application No. 60/703,815, filed on Jul. 29, 2005, entitled "High Temperature Superconducting Wires and Coils," which is incorporated herein by reference in its entirety.

This application is related to co-pending U.S. patent application Ser. No. 11/193,262, filed on Jul. 29, 2005, and entitled "Architecture For High Temperature Superconductor Wire," the entire contents of which are incorporated herein by reference.

FIELD OF THE INVENTION

The present invention relates generally to high temperature superconducting wires. In particular, the invention relates to coated conductors, also called second generation, high temperature superconductor wires or tapes. The present invention also relates to superconducting structures that can maintain a constant current in varying magnetic field orientations.

BACKGROUND OF THE INVENTION

Since the discovery of high-temperature superconducting (HTS) materials (superconducting above the liquid nitrogen temperature of 77 K) there have been efforts to develop various engineering applications using such HTS materials. In thin film superconductor devices and wires, the most progress has been made with fabrication of devices utilizing an oxide superconductor including yttrium, barium, copper and oxygen in the well-known basic composition of $YBa_2Cu_3O_{7-x}$ (hereinafter referred to as Y123). Progress has also been made with compositions containing rare earth elements ("RE") partially substituted for Y. Biaxially textured superconducting metal oxides, such as Y123, have achieved high critical current densities in a coated conductor architecture. These wires, often referred to as second generation HTS wires, are the preferred material for many applications, including cables, motors, generators, synchronous condensers, transformers, current limiters, and magnet systems for military, high energy physics, materials processing, transportation and medical uses.

The current carrying capability of the HTS material is strongly related to its crystalline alignment or texture. The oxide superconductor grains typically are aligned with their c axis perpendicular to the plane of the wire surface and the ab plane parallel to the wire surface. Grain boundaries formed by the misalignment of neighboring crystalline HTS grains are known to form an obstacle to superconducting current flow, but this obstacle decreases with the increasing degree of alignment or texture. Therefore to make the material into a commercially viable product, e.g. an HTS wire, the HTS material must maintain a high degree of crystalline alignment or texture over relatively long distances. Otherwise, the superconducting current carrying capacity (critical current density) will be limited.

HTS materials can be fabricated with a high degree of crystallographic alignment or texture over large areas by growing a thin layer of the material epitaxially on top of a flexible tape-shaped substrate, fabricated so that it has a high degree of crystallographic texture at its surface. When the crystalline HTS material is grown epitaxially on this surface, the crystal alignment of the HTS material grows to match the texture of the substrate. In other words, the substrate texture provides a template for the epitaxial growth of the crystalline HTS material. Further, the substrate provides structural integrity to the HTS layer.

A substrate can be textured to provide a template that yields an epitaxial HTS layer. Materials such as nickel, copper, silver, iron, silver alloys, nickel alloys, iron alloys, stainless steel alloys, and copper alloys can be used, among others. The substrate can be textured using a deformation process, such as one involving rolling and recrystallization annealing the substrate. An example of such a process is the rolling-assisted biaxially textured substrate (RABiTS) process. In this case large quantities of metal can be processed economically by deformation processing and annealing and can achieve a high degree of texture.

One or more buffer layers can be deposited or grown on the substrate surface with suitable crystallographic template on which to grow the HTS material. Buffer layers also can provide the additional benefit of preventing diffusion of atoms from the substrate material into the crystalline lattice of the HTS material or of oxygen into the substrate material. This diffusion, or "poisoning," can disrupt the crystalline alignment and thereby degrade the electrical properties of the HTS material. Buffer layers also can provide enhanced adhesion between the substrate and the HTS layer. Moreover, the buffer layer(s) can have a coefficient of thermal expansion that is well matched to that of the superconductor material. For implementation of the technology in commercial applications, where the wire may be subjected to stress, this feature is desirable because it can help prevent delamination of the HTS layer from the substrate.

Alternatively, a non-textured substrate such as Hastelloy can be used, and textured buffer layers deposited by means such as the ion-beam-assisted deposition (IBAD) or inclined substrate deposition (ISD). Additional buffer layers may be optionally deposited epitaxially on the IBAD or ISD layer to provide the final template for epitaxial deposition of an HTS layer.

By using a suitable combination of a substrate and one or more buffer layers as a template, an HTS layer can be grown epitaxially with excellent crystal alignment or texture, also having good adhesion to the template surface, and with a sufficient barrier to poisoning by atoms from the substrate. The HTS layer can be deposited by any of a variety of methods, including the metal-organic deposition (MOD) process, metal-organic chemical vapor deposition (MOCVD), pulsed laser deposition (PLD), thermal or e-beam evaporation, or other appropriate methods. Lastly, a cap layer can be added to the multilayer assembly, which helps prevent contamination of and damage to the HTS layer from above. The cap layer can be, e.g., silver, and can be, e.g., sputtered onto the HTS layer.

HTS wire development continues to seek improvements in critical current density, in particular, critical current density in high magnetic fields and temperatures ($J_c(H,T)$). This improvement can come by improving the "pinning" of the superconducting vortices, which is the underlying mechanism for high critical current density $J_c$ in HTS materials. To achieve pinning in superconductors, local potential energy differences should be matched in size as closely as possible to the size of the normal core of the superconducting flux line or vortex. The cross-sectional core has a size on the order of the coherence length, which is several nanometers in high temperature superconducting cuprates and grows with temperature. Thus, nanometer-sized defects are introduced into the oxide superconductor grains to pin flux lines and improve current carrying properties in a magnetic field.

The current carrying properties of crystallographically aligned layers of oxide superconductor are dependent on magnetic field orientation. FIG. 1 shows the typical field dependence of a metal-organic deposited (MOD) Y123 film on an oxide-buffered metal substrate with magnetic field oriented parallel and perpendicular to the planar face of the film. At both 27K and 75K, with the magnetic field oriented perpendicular to the planar face of the film, there is a significant decrease in Ic from the value in parallel orientation, limiting the usefulness of the Y123 wires in many coil applications. Many anticipated applications are planned for temperatures in the 55 to 65K region, in magnetic fields of 1-3 Tesla oriented perpendicular to the planar face of the film, which are conditions at which performance drops significantly. In addition to the parallel and perpendicular performance of the Y123 wires in magnetic field, it is important to examine the field performance at intermediate angles as shown in FIG. 2. As seen in FIG. 2, Y123 films typically show a small peak in the c-axis (0° and 180° or perpendicular to the planar face of the Y123 film), which can be enhanced through the presence of extended planar or linear defects (e.g., twin boundaries, grain boundaries, a-axis grains).

In many applications, e.g., motors and magnetic coils, HTS wires will experience local variations in the magnetic field orientation, so that the magnetic field experienced in one region of the wire can be quite different from the magnetic field experienced in another wire region. In such applications, the Y123 wire performance is determined by the minimum performance at any magnetic field orientation, and not solely by that at the perpendicular orientation. Thus, the HTS wire demonstrates reductions in current density in regions where the magnetic field deviates from an optimum orientation.

SUMMARY

High temperature superconducting (HTS) wires are described, which may be used in applications and devices experiencing different magnetic field orientations at different locations within the wire or device. The HTS wires contain at least two superconducting layers, each of which is selected for its performance at a particular magnetic field orientation. By selecting a combination of superconducting layers, the HTS wire exhibits optimum performance in magnetic fields oriented parallel to the wire surface (H//ab) or, perpendicular to the wire surface (H//c), or at intermediate orientations.

In one aspect of the invention, a superconducting wire, includes at least first and second superconducting layers disposed on one or more substrates in stacked relationship. The first superconducting layer includes a first high temperature superconducting oxide selected to provide a first predetermined ratio of critical current parallel to the surface of the superconductor layer to critical current perpendicular to the surface of the superconductor layer (Ic(ab)/Ic(c)), and the second superconducting layer includes a second high temperature superconducting layer selected to provide a second predetermined ratio of critical current parallel to the surface of the superconductor layer to critical current perpendicular to the surface of the superconductor layer (Ic(ab)/Ic(c)). The first and second superconductor layers, in combination, provide a predetermined overall critical current Ic in a selected magnetic field orientation.

In one or more embodiments, the first or the second high temperature superconductor is selected to provide enhanced critical current (Ic(c)) in the presence of magnetic fields oriented perpendicular to surface of the superconducting layer (H//c). The first predetermined ratio for Ic(ab)/Ic(c) is less than or equal to 2.6, is less than 2.0, or less than 1.5, in an applied magnetic field of 1 Tesla or greater, e.g., in the range of about 1 Tesla to about 6 Tesla.

In one or more embodiments, the high temperature superconductor includes a rare earth-alkaline earth-copper oxide including two or more rare earth elements, e.g., one or more of erbium and holmium. Holmium and/or erbium are present in an amount in the range of 25% to 150% of the stoichiometric amount of rare earth in rare earth-alkaline earth-copper oxide.

In one or more embodiments, the high temperature superconductor includes a rare earth-alkaline earth-copper oxide and at least one second phase nanoparticle comprising a metal-containing compound located within a grain of the oxide superconductor.

In one or more embodiments, the first or the second high temperature superconductor composition is selected to provide enhanced critical current (Ic) in the presence of magnetic fields oriented parallel to surface of the superconducting layer (H//ab). The second predetermined ratio for Ic(ab)/Ic(c) is greater than 2.5, or greater than 3.5, or greater than 5.5, in an applied magnetic field of 1 Tesla or greater, e.g., in the range of about 1 Tesla to about 6 Tesla.

In one or more embodiments, the high temperature superconductor includes a rare earth-alkaline earth-copper oxide, wherein the copper to alkaline earth ratio is greater than 1.5.

In one or more embodiments, the thicknesses of the first and second superconductor layers are different, the thickness of the first and second superconductor layers are selected to provide a predetermined overall critical current in a selected magnetic field orientation. Additional layers that enhance critical current density in magnetic fields either parallel or perpendicular to the surface of the superconductor layer maybe included.

In one or more embodiments, the selected magnetic field orientation is between 0° (H//c) and 90° (H//ab).

In one or more embodiments, the superconductor wire includes a first coated element. The first coated element includes a first substrate, at least one first buffer layer disposed on the first substrate and supporting the first superconducting layer, and a first metallic protective layer disposed on the first superconductor layer. The second coated element includes a second substrate, at least one second buffer layer disposed on the second substrate and supporting the second superconducting layer, and a second metallic protective layer disposed on the second superconductor layer.

In one or more embodiments, the superconducting wire also includes an intervening binder layer disposed between the first and second coated elements such that the first and second coated elements are joined at the first and second substrates, or an intervening binder layer disposed between the first and second coated elements such that the first and second coated elements are joined at the first and second metallic protective layers.

Another aspect of the invention involves a method of making a high temperature superconducting device. The method includes providing a length of superconducting wire comprising a first region comprising a high Ic(c) high temperature superconductor composition, a second region comprising of a high Ic(ab) high temperature superconductor composition, and a third region comprising a mixture of the high Ic(c) high temperature superconductor composition and the high Ic(ab) high temperature superconductor composition, and arranging the length of superconductor in the device such that the first region occupies a location in the device experiencing a magnetic field orientation perpendicular (0°) to the high temperature wire, the second region occupies a location in the device experiencing a magnetic field orientation parallel (90°) to the high temperature wire, and the third region occupies a location in the device experiencing a magnetic field orientation between 0° and 90°.

In one or more embodiments, the device is a coil; the first region of the high temperature superconductor wire is positioned at the ends of the coil; the second region of the high temperature superconductor wire is positioned in the interior of the coil; and the third region of the high temperature superconductor wire is positioned between the first and second regions.

In another aspect of the invention, an article includes a superconducting wire comprising a high temperature superconductor layer, wherein the article experiences a magnetic field of differing orientation at different locations in the article, and wherein the composition of the high temperature superconductor layer is varied along its length to accommodate the orientation of the magnetic field in a given location.

In one or more embodiments, the article is a coil and, in operation, the coil experiences induced magnetic fields that range from substantially parallel to the plane of the superconductor layer to substantial perpendicular to the plane of the superconductor layer.

In one or more embodiments, the composition of the superconductor wire is primarily a high Ic(c) high temperature superconductor composition in a first region of the coil that experiences magnetic fields perpendicular to surface of the superconducting layer during operation; the composition of the superconductor wire comprises primarily a high Ic(ab) high temperature superconductor composition in a second region of the coil that experiences magnetic fields that are substantially parallel to surface of the superconducting layer during operation; and the composition of the superconductor wire comprises a mixture of a high Ic(c) high temperature superconductor composition and a high Ic(ab) high temperature superconductor composition in a region of the coil that experiences magnetic fields that are at an angle of between 0 and 90 degrees to surface of the superconducting layer during operation.

The selection of superconductor layers with different current carrying performances in different magnetic fields alters the Ic anisotropy along H//ab and H//c directions. In particular, Ic and hence Jc, are increased along H//c without reducing the Ic capacity along H//ab.

By "stacked relationship" it is meant that the elements are arranged in a stack, e.g., in overlaying relationship to one another wherein the layers may be in contact or they may have one or more intervening layers between them. No stacking order is suggested or implied.

BRIEF DESCRIPTION OF THE DRAWINGS

The invention is described with reference to the following figures in which like references refer to like elements and which are presented for the purposes of illustration only and are not intended to be limiting of the invention.

DETAILED DESCRIPTION

Figure 1:
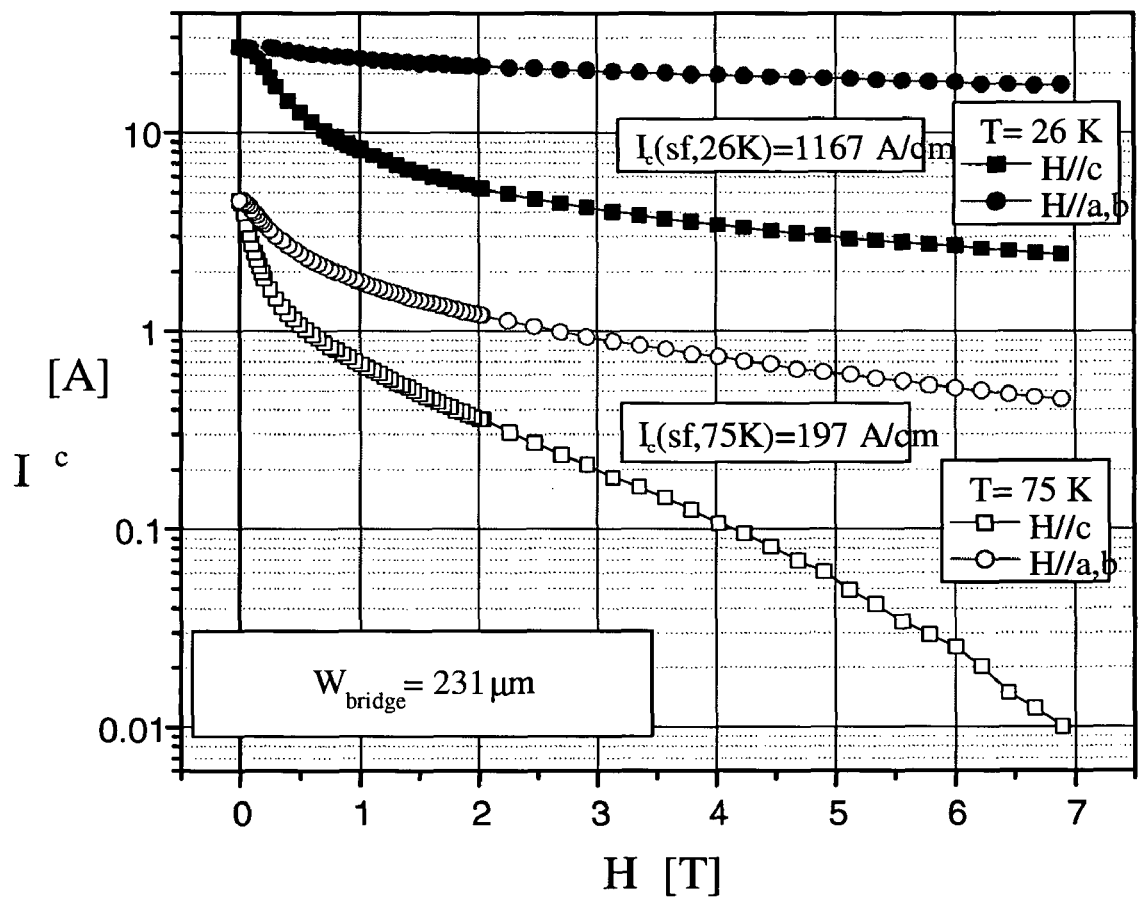
FIG. 1 illustrates the critical current (Ic) for a Y-123 HTS wire in magnetic fields (H) of increasing strength and with magnetic fields oriented parallel (H//ab, $\ominus$=90°) and perpendicular (H//c, $\ominus$=0°) to the planar face of the film at 26K and 75K.
Figure 2:
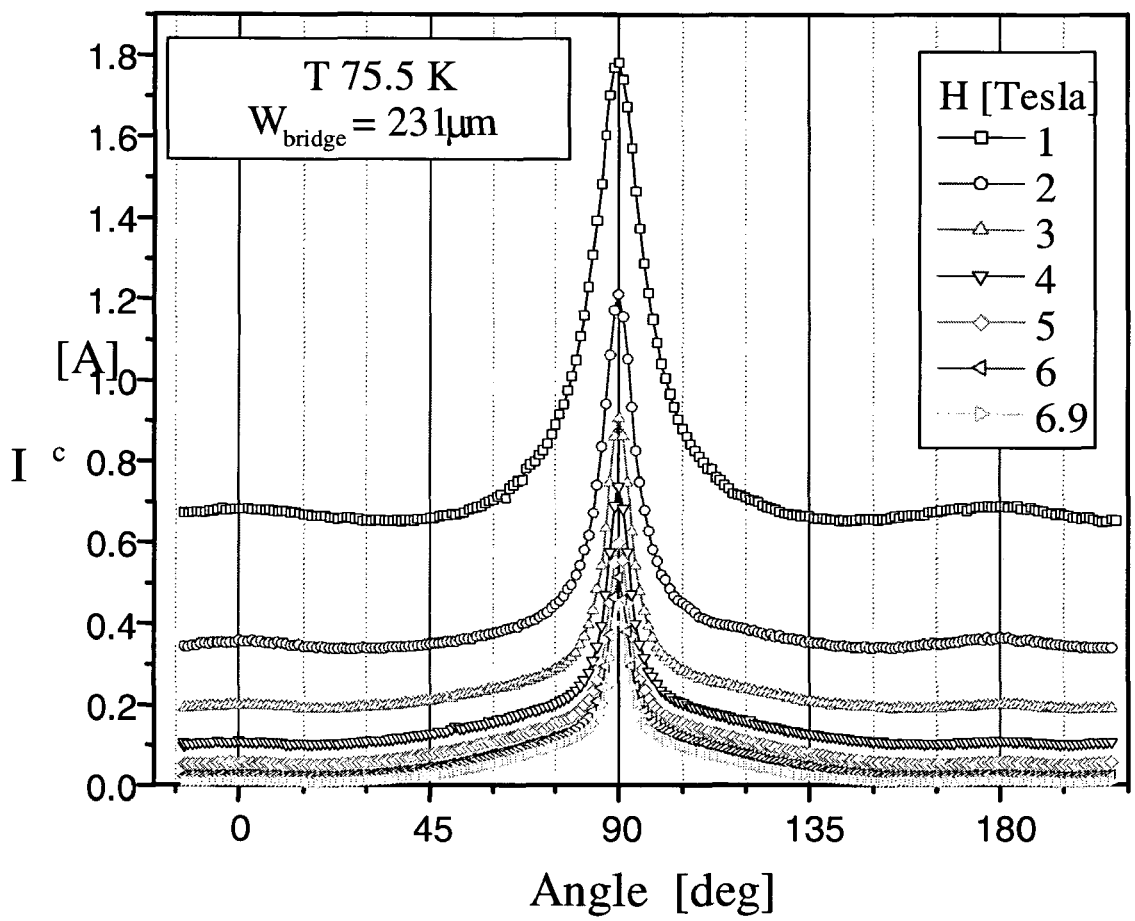
FIG. 2 illustrates the field performance (Ic) at intermediate magnetic field orientations (0°<$\ominus$<90°) for the HTS wires of FIG. 1 at applied magnetic fields of 1-7 T.
Figure 3:
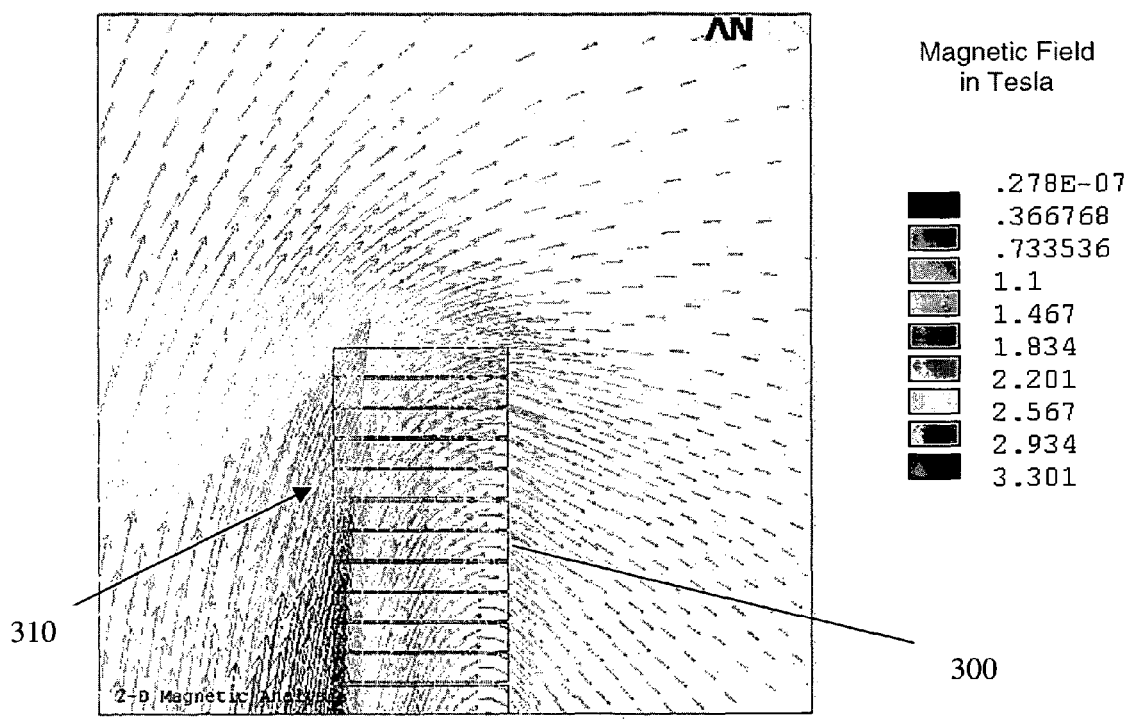
FIG. 3 illustrates the magnetic field distribution around the end turns of a solenoid electromagnet.

FIG. 3 shows a two-dimensional plot of the magnetic field distribution around the end turns 300 of a solenoid electromagnet 310, which demonstrates that both the field strength (H) (designated in arrows of different colors, where the colors correspond to the field strengths shown in the side bar of FIG. 3) and field orientation ($\ominus$) (designated by arrow orientation) vary dramatically at different locations in the coil. An HTS wire that is optimized for electrical current carrying properties in a particular magnetic field will exhibit different currents (Ic), and hence different current densities (Jc), in different regions of the coil as each region of the coil experiences a magnetic field of different orientation. The performance of the coil is limited by the minimum performance of the wire. Thus, the overall current of the wire is reduced throughout and the wire functions at only a fraction of its current capacity over long lengths of the wire. If the current capacity can be increased for those underperforming regions of the wire, the current of the entire wire as a whole can be improved.

RE123 superconducting oxide grains typically exhibit strong anisotropy in a magnetic field, with the current in a magnetic field oriented in the (ab) plane of the oxide grain (along the surface of an epitaxial HTS layer) being much higher than the current in a magnetic field oriented perpendicular to the HTS layer. Ic(ab) can be two times, three times, and even more than ten times greater than Ic(c); and the anisotropy becomes more noted at higher magnetic field strength. While certain HTS materials have been observed to reduce magnetic field anisotropy, improvements in Ic(c) are typically obtained at the expense of Ic(ab).

In one aspect of the invention, an HTS wire operates at higher percentage of the total current capacity than a conventional HTS wire. In one or more embodiments, the HTS wire operates at near full current load. Current carrying characteristics are improved by using HTS materials with different performance characteristics in different regions of an HTS wire or device. The HTS material is selected for optimal performance in the anticipated local magnetic field orientation. Thus, by way of example, an HTS wire includes two superconducting layers that are selected to provide optimal performance in the local applied magnetic field. The two layers may be arranged or stacked in any order. In regions where the HTS wire experiences an applied magnetic field oriented parallel to the plane of the superconductor layer (H//ab or $\Theta=90°$), both layers may contain a superconductor layer having a composition and structure that provides optimal current along H//ab, that is, Ic(ab)>>Ic(c). In regions where the HTS wire experiences an applied magnetic field oriented perpendicular to the plane of the superconductor layer (H//c or $\Theta=0°$), both layers may contain a superconductor layer having a composition and structure that provides optimal current along H//c, that is, the Ic anisotropy is reduced to a desired level. In regions where the HTS wire experiences an applied magnetic field whose orientation is intermediate to H//ab and H//c, a first layer may contain a superconductor layer having a composition and structure that provides optimal current performance along H//ab, and a second layer may contain a superconductor layer having a composition and structure that provides optimal current along H//c. The relative thickness of the two layers is selected to provide the desired balance of Ic(c) and Ic(ab) performance. The HTS wires provide an overall critical current of a desired performance, e.g., a desired current load.

In one or more embodiments, the HTS wire carries an overall Ic(c) in at least a portion of its length of at least 80 A/cm-width; and Ic(ab)/Ic(c) is greater than 2.0, or about 2-3; or Ic(c) is about 120-150 A/cm-width and Ic(ab)/Ic(c) is greater than 2.0 or about 2-3; or Ic(c) is about 150-180 A/cm-width and Ic(ab)/Ic(c) is greater than 2.0, or about 2-3. The overall Ic(c) is attained by the additive current performance of the two superconducting layers. Specifying a high Ic(c) ensures that at least one of the layers performs well in a perpendicular magnetic field. Specifying that Ic(ab) be a multiple of Ic(c) of 2 or more ensures that current in a parallel field is even higher. The overall current performance may be attained in a variety of combinations, such as combining two wires having moderate Ic(c) and moderate Ic(ab). Alternatively, a wire of superior Ic(c) can be combined with a wire of poor Ic(c), but good Ic(ab).

In addition to providing the desired combination of high Ic(ab) superconductor layers and high Ic(c) superconductor layers, the two layer HTS wires increase critical current density over comparable single layer superconductor wires by substantially doubling the volume of superconductor material in the HTS wire.

Figure 4A:
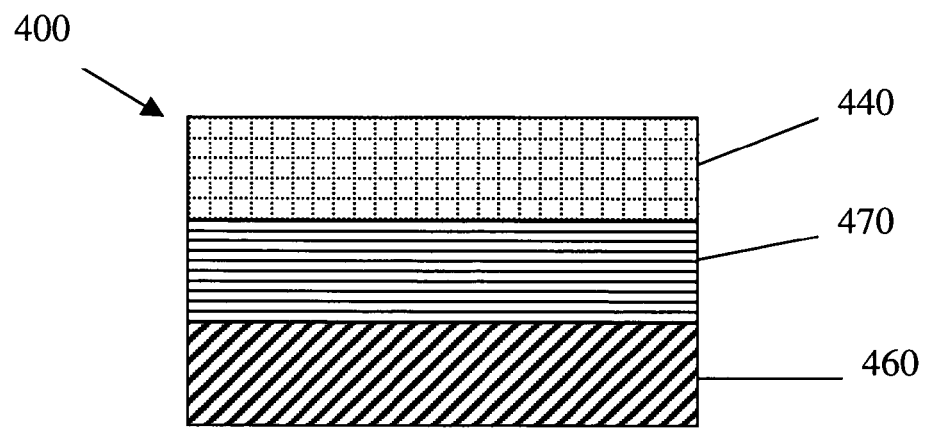
FIG. 4 is a cross-sectional illustration of a two layer HTS wire having two superconductor layers with (A) high Ic(ab); (B) high Ic(c) and (C) one layer each of high Ic(ab) and Ic(c)
FIG. 4D is a cross-sectional illustration of a two layer HTS wire having a copper interlayer.

In one or more embodiments, the superconducting layers may be coated on the same side of the substrate. FIG. 4A illustrates a double layer HTS wire 400 in which one superconducting layer having optimal Ic(ab) 440 and one superconducting layer having optimal Ic(c) 470 are coated on the same side of the substrate 460. It should be noted that in this and all subsequent figures, the dimensions are not to scale. The substrate may be a textured metal substrate or a metal substrate that includes a textured substrate and is generally of a thickness in the range of about 0.05-0.2 mm. A metal substrate, such as Ni, Ag, or Ni alloys (e.g., NiW or other Hastalloy metals) provides flexibility for the wire and can be fabricated over long lengths and large areas. The superconducting layer comprises a material that is selected for its good performance in either H//ab or H//c. In addition, the superconductor layer is crystallographically aligned so that the ab plane of the oxide superconductor is parallel to the wire surface. Each superconducting layer is generally in the range of about 0.5 μm to about 2.0 μm, and may be even greater. An HTS wire as illustrated in FIG. 4A is typically useful in a wire or region of a wire experiencing a magnetic field of intermediate orientation, that is, $0°<\Theta<90°$.

Figure 4B:
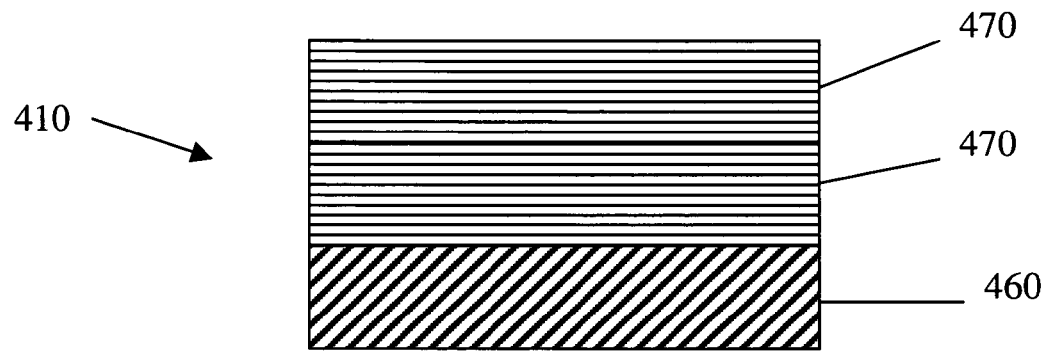
Figure 4C:
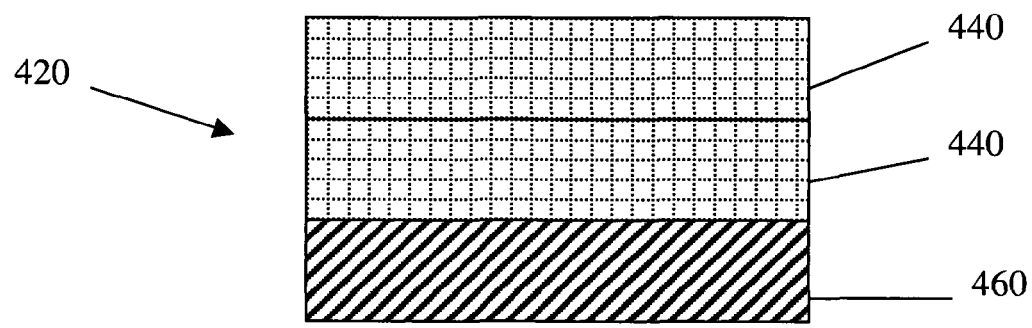

In regions of the wire where $\Theta$ is about 0°, a double layer HTS wire 410 in which two superconducting layers 470 having optimal Ic(c) are coated on the same side of the substrate 460 may be used, as FIG. 4B illustrates. FIG. 4C illustrates a double layer HTS wire 420 in which two superconducting layers having optimal Ic(ab) 420 are coated on the same side of the substrate 460. The HTS layer demonstrates an optimal performance in H//ab. In order to provide a wire having optimal performance in a device experiencing different magnetic field orientations, a wire may include any one of these architectures at different locations in the device corresponding to different field orientations.

Figure 4D:
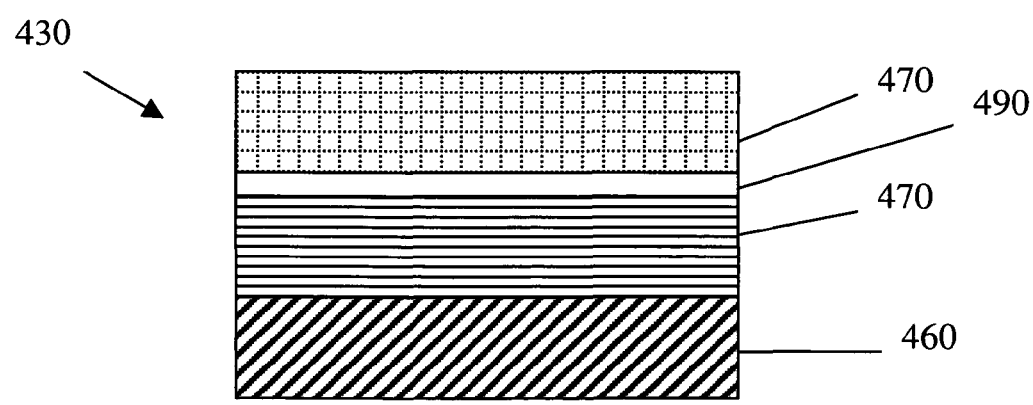

In one or more embodiments, a conducting or insulating layer 490 may be disposed between the first and second superconductor layers as illustrated for HTS wire 430 in FIG. 4D. Conductor layers provide electrical connection between the two layers and can be, for example, copper, and silver. Exemplary insulating layers include metal oxides such as $Y_2O_3$, CuO and $CeO_2$. Any interlayer should be structurally and chemically compatible with the HTS material and have, for example, a textured crystalline structure that permits the deposition of an epitaxial HTS layer. The interlayer thickness is generally in the range of 20 nm to 200 nm, and is deposited, for example, by sputtering, evaporation deposition or pulsed vapor deposition, or other conventional methods.

Figure 5A:
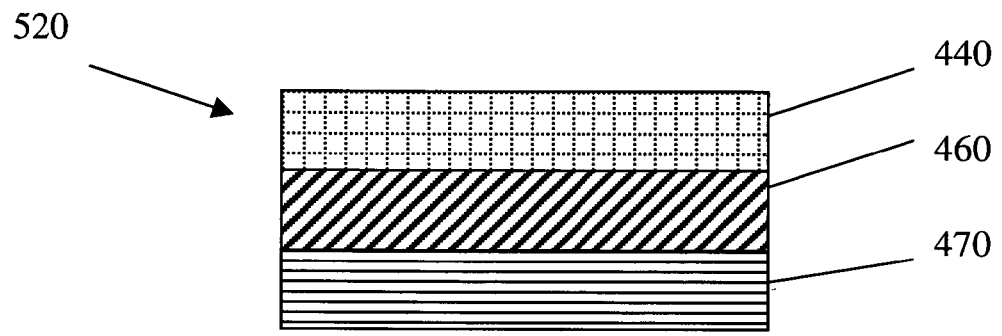
FIG. 5 is a cross-sectional illustration of a double sided HTS wire having two superconductor layers with (A) high Ic(ab), (B) high Ic(c) and (C) one layer each of high Ic(ab) and Ic (c).
Figure 5B:
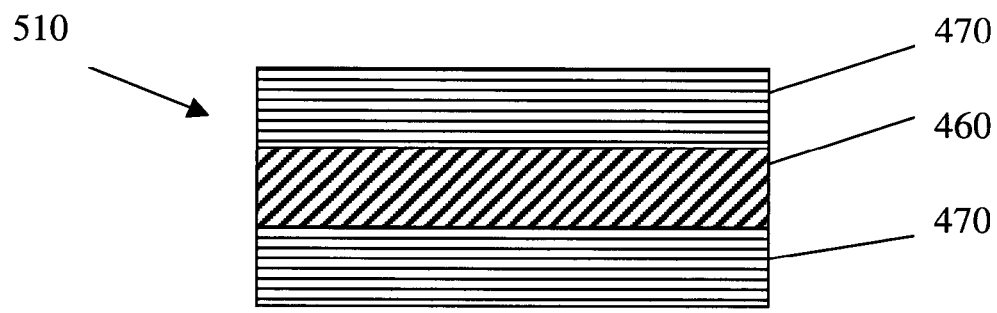
Figure 5C:
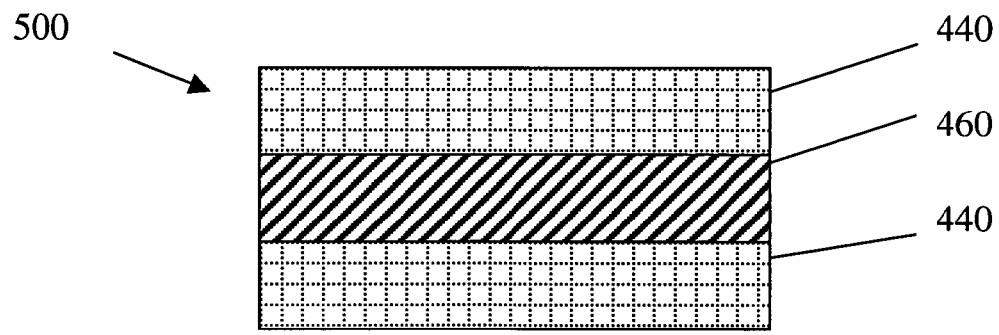

In one or more embodiments, the superconductor layers are coated on opposite sides of the substrate. FIG. 5A illustrates a double layer HTS wire 520 in which one superconducting layer having optimal Ic(//ab) 440 and one superconducting layer having optimal Ic(//c) 470 are coated on opposite sides of the substrate 460. FIG. 5B illustrates a double layer HTS wire 510 in which two superconducting layers 470 having optimal Ic(//c) are coated on opposite sides of the substrate 460. FIG. 5C illustrates a double layer HTS wire 500 in which two superconducting layers having optimal Ic(//ab) 440 are coated on opposite sides of the substrate. Additional superconducting layers may be included on either side of the substrate and may enhance either Ic(c) or Ic(ab).

The HTS wires illustrated in FIGS. 4A-4D and FIGS. 5A-5C and elsewhere in this description include one or more buffer layers (not shown) disposed between the substrate and superconductor layer and one or more cap layers (not shown) overlaying the superconductor. In one or more embodiments, the buffer layer is made up of an electrically insulating material, though electrically conductive materials also can be used. The buffer layer is made up of, e.g., an inert metal, an oxide, zirconate, titanate, niobate, nitride, tantalate, aluminate, cuprate, manganate, or ruthenate of a metal or rare earth element (e.g. $Al_2O_3$, $CeO_2$, $Y_2O_3$, MgO, $Gd_2O_3$, strontium titanate, gadolinium zirconate, yttria-stabilized zirconia, AlN, $Si_3N_4$, $LaMnO_4$, $La_2Zr_2O_7$, or $La_{2-x}Ce_xZr_2O_7$. The buffer layers may be deposited using any known method, including physical and chemical deposition methods. A cap layer overlays the superconducting layer and provides protection of the superconducting layer from chemical and mechanical degradation. The cap layer may be conductive. The cap layer may be sputtered Ag or other inert metal.

In one or more layers, superconducting materials having high Ic(ab) or high Ic(c) are obtained by selective processing of the layers. In the examples above, wherein the two superconductor layers are deposited on the same substrate, this can be accomplished by changing the processing conditions used to form the superconductor during the process. Typically, reaction to form the superconductor is initiated at the interface with the underlying buffer layer and the superconductor grows from that interface outward. Thus, changing conditions midway in the process from those that favor a high Ic(c) material to those that favor a high Ic(ab) material results in a layered structure with different current carrying properties. Alternatively, the two superconductor layers can be separately processed to optimize performance and joined after HTS formation.

Exemplary superconducting materials having good performance in H//ab include rare earth (RE)-alkaline earth-copper oxides in which the metals are substantially in stoichiometric proportions. Thus, by way of example, RE-123, in which the rare earth, barium and copper are in substantially 1:2:3 proportions have been found to exhibit optimal current in magnetic fields oriented parallel to the ab plane. An exemplary oxide superconductor is $YBa_2Cu_3O_{7-\delta}$.

Superconducting materials rich in copper or deficient in alkaline earth metal also exhibit high Ic(ab). In one or more embodiments, the superconducting oxide is a rare earth barium copper oxide in which the copper to barium ratio is greater than 1.5. The Cu:Ba ratio is achieved by reducing the amount of barium in the oxide superconductor, i.e., the proportion of barium is less than 2.0, or by increasing the copper content, i.e., the proportion of copper is greater than 3.0, in the RE-123 composition. In some embodiments, the oxide superconductor contains an excess of copper, for example, up to 5% excess, or up to 10% excess or up to 20% excess copper as compared to the amount of copper required to prepare stoichiometric RE-123. In other embodiments, the oxide superconductor contains an deficiency of barium, for example, up to 5% deficiency, or up to 10% deficiency or up to 20% deficiency of barium as compared to the amount of copper required to prepare stoichiometric RE-123.

In one or more embodiments, a copper interlayer is used in whole or in part to supply excess copper. For example, a copper layer is deposited as an interlayer in between two superconductor layers in a double layer wire, as in FIGS. 4A-4D. During the necessary heat treatments to form the oxide superconductor, copper diffuses into both superconductor layers 440, 470, forming copper-rich HTS layers. Further information on the use of copper interlayers in the processing of copper-rich HTS wires is found in co-pending and commonly owned United States Patent Publication No. 2006-0094603, published on May 4, 2006, and entitled "Thick Superconductor Films With Improved Performance," the entire contents of which are incorporated by reference.

Figure 6:
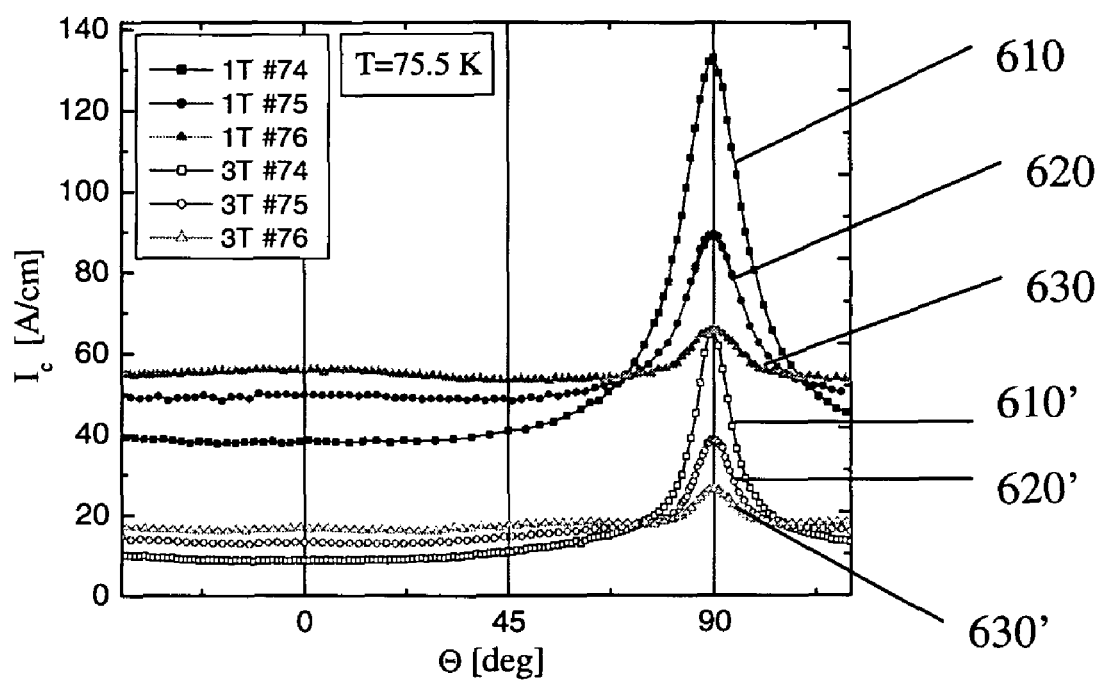
FIG. 6 is a plot of critical current (Ic) versus magnetic field orientation ($\ominus$) at 75 K for superconducting oxides of various compositions, measured at 1 T and 3 T.

In certain embodiments, increases in Cu concentration of up to 20% excess Cu increase the Ic(ab). FIG. 6 is a plot of critical current (Ic) versus magnetic field orientation ($\Theta$, 75K) for oxide superconductors of various compositions. Curves 610 and 610' measure the current over a range of $\Theta$ at 1 T and 3 T, respectively, for a Y-123 layer containing 7.5% excess copper. The curves exhibit a strong maximum at 90° (H//ab) and a minimum at 0° (H//c), thus demonstrating the optimal performance of this superconductor composition at H//ab. Copper-rich Y-123 also exhibits a strong current anisotropy between H//ab and H//c, where the ratio of Ic(ab) to Ic(c) is about 2.4 at 1 T and 6 at 3 T. In one or more embodiments, a high Ic(c) superconductor has an Ic(c) of greater 20-55 A/cm-width 65K at 3 T and an Ic(ab)/Ic(c) ratio greater than 2.5, or greater than 3.5 or greater than 5.5 in a magnetic field of at least 1 Tesla. Such ratios have been obtained for magnetic field strengths of up to 6 Tesla and it is anticipated that such ratios may be appropriate in even higher magnetic fields.

Exemplary superconducting materials having good performance in H//c include rare earth (RE)-alkaline earth-copper oxides containing an excess of rare earth element or two or more rare earth elements in stoichiometric proportions or in excess of stoichiometric proportions. Without being bound by any particular mode of operation, the excess rare earth is believed to improve Ic(c) by forming nanoscale defects that serve as flux pinning centers. Atomistic defects may be achieved by introducing different rare earth elements into the Y-123 superconductor. In one or more embodiments, up to about 25% addition to, for example, a yttrium-containing composition, or up to about 150% substitution of a rare earth element is contemplated. In one or more embodiments, the rare earth element is holmium and/or erbium. Introduction of two or more rare earths into the oxide superconductor layer not only increases Ic(c), but it also decreases the difference (anisotropy) between Ic(ab) and Ic(c). Referring to FIG. 6, curves 620 and 620' measure the current over a range of (e at 1T and 3T, respectively, for a Y-123 layer containing 25% erbium addition to the superconductor composition, e.g., Y:Er=4:1. Curves 630 and 630' measure the current over a range of magnetic field orientations at 1T and 3T, respectively, for a Y-123 layer containing 50% additional erbium, e.g., Y:Er=2:1. The critical current at 90° (H//ab) has decreased significantly, while the critical current at 0° (H//c) has increased, thus demonstrating that the composition of the superconducting layers can be selected to improve the critical current at H//c, in absolute terms, as well as to reduce the current anisotropy between Ic(ab) and Ic(c). The ratio of Ic(ab) to Ic(c) for the 25% erbium-supplemented Y-123 is about 1.8 at 1 T and 2.6 at 3 T, while the ratio of H//ab to H//c for the 50% erbium-supplemented Y-123 is about 1.2 at 1 T and 1.6 at 3 T. This is considerably less than the current anisotropy of a high Ic(ab) wire. Compare, Ic(ab)/Ic(c) of 2.4 (1 T) and 6.0 (3 T) for copper-rich Y-123. In one or more embodiments, a high Ic(c) superconductor layer has an Ic(ab)/Ic(c) ratio of less than 2.6, or less than 2.0 or less than 1.5 in a magnetic field of at least 1 Tesla. Such ratios have been obtained for magnetic field strengths of up to 6 Tesla and it is anticipated that such ratios may be appropriate in even higher magnetic fields.

In one or more embodiments, the high Ic(c) superconductor material includes a second phase nanoparticle within the grain of the oxide superconductor. The nanoparticle is made up of a metal-containing compound and may contain one or more of rare earth element, an alkaline earth metal, and a transition metal. The second phase nanoparticle may be one or more of zirconium oxide, aluminum oxide, $Y_2Cu_2O_5$, $Y_2BaCuO_4$, magnesium oxide, $BaZrO_3$, silver and $CeO_2$. Other compositions suitable for forming nanometer-sized defects in the oxide superconductor grains to pin flux lines and improve current carrying properties in a magnetic field are found in co-pending and commonly owned application U.S. Ser. No. 10/758,710, filed Jan. 16, 2005, and entitled "Oxide Films with Nanodot Flux Pinning Centers," the entirety of which is incorporated by reference.

In one or more embodiments, the thickness of the high Ic(ab) and high Ic(c) layers may be selected to provide a preselected performance in a magnetic field orientation. Thus, by way of example, to make a tape or wire most suitable to perform in a magnetic field with orientation 45 degrees to the tape surface, one can use both a high Ic(c) superconductor layer and a high Ic(ab) superconductor layer, where the Ic(c) layer is thinner relative to the Ic(ab) layer based on data such as is presented in FIG. 6. The relative thickness of the two layers can be adjusted to obtain, for example, Ic(c)>80 A/cm-width and Ic(ab)/Ic(c) of greater than 2, or Ic(c)>120-150 A/cm-width and Ic(ab)/Ic(c) of greater than 2, or Ic(c)>150-180 A/cm-width and Ic(ab)/Ic(c) of 2-3.

In one or more embodiments, the superconductor layers are deposited by metal organic deposition (MOD). A precursor solution containing the constituent elements of the first oxide superconductor layer is deposited and the precursor layer is decomposed into an intermediate metaloxy layer before application of the second superconductor layer. A second precursor solution containing the constituent metallic elements of the second oxide superconductor layer is then deposited and decomposed into an intermediate metaloxy layer. The two intermediate layers are then fully converted into an HTS layer. By way of example, the precursor solutions may include metal salts including fluoride, and the precursor may be decomposed to form an intermediate metal oxyfluoride layer. The metal oxyfluoride layer may be further heat treated to form an oxide superconductor. In other embodiments, the first precursor layer is deposited and fully converted into an oxide superconductor layer. The second precursor layer is then deposited and also fully converted into an oxide superconductor layer. Each superconductor layer can be a thickness of about 0.6 µm to about 1.5 µm, or even greater. The total thickness of the superconducting layers can range from about 0.6 µm to about 2.0 µm and generally does not exceed about 3 µm.

In other embodiments, each superconducting layer is deposited on a separate substrate, i.e., an HTS assembly. The coated substrates are then joined to form an HTS wire containing two substrate/superconductor layer assemblies. As used herein, the expression "HTS assembly" indicates a multilayer structure including a substrate, one or more buffer layers, a superconductor layer, and one or more cap layers.

Figure 7:
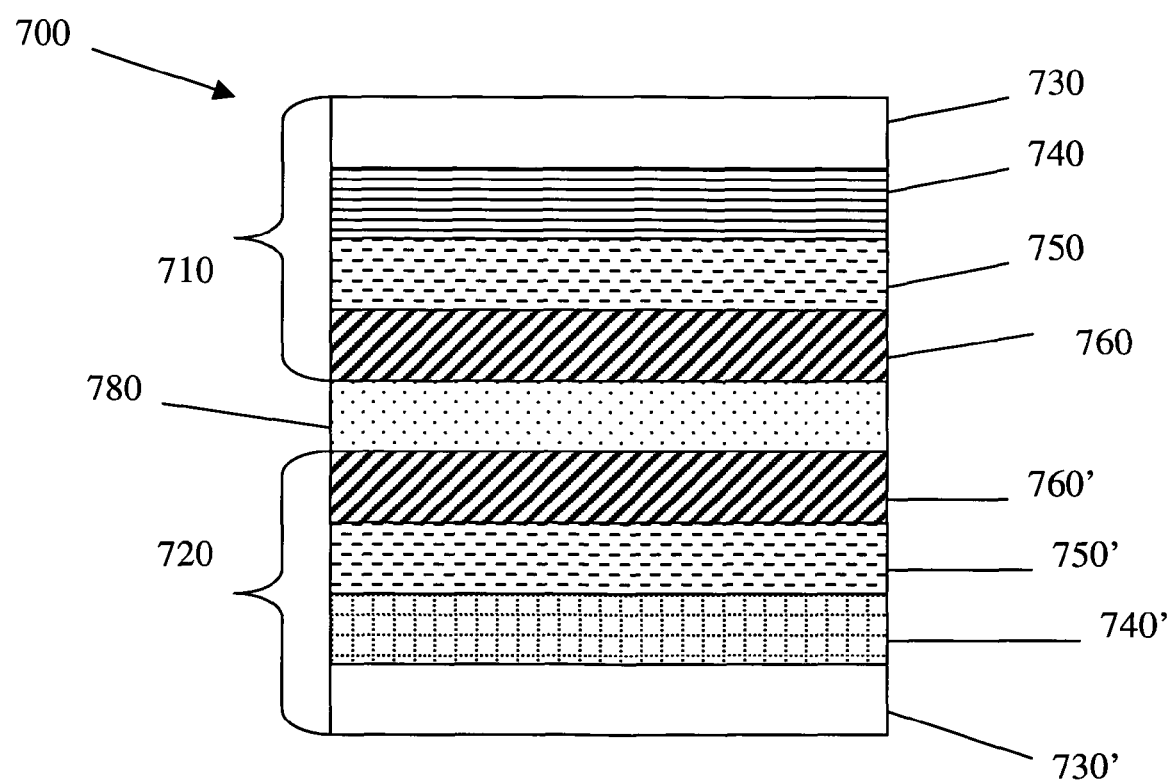
FIG. 7 is a cross-sectional illustration of two HTS assemblies joined at their respective substrates, in which a first assembly has a superconductor layer having high Ic(ab) and the second assembly has a second superconducting layer having high Ic(c).

The HTS assemblies may be joined at their respective substrates, so that the capped superconductor layers face outward, as illustrated in FIG. 7. HTS wire 700 is made up of two HTS assemblies 710 and 720. Each of these assemblies is fabricated using techniques known in the art and that are described in greater detail herein. Assembly 710 includes a metal substrate 760. Substrate 760 contains at least a biaxially textured surface to provide a crystal template for buffer layer 750 and HTS layer 740. Buffer layer 750 overlays substrate 760 and may comprise one or more layers. HTS layer 740 overlays buffer layer 750 may be any HTS material. In one or more embodiments, the HTS layer includes a rare earth-alkaline earth-copper oxide, such as Y-123, that is optimized for performance in either H//ab or H//c. Cap layer 730 is located above HTS layer 740 and provides protection of the HTS layer from chemical and mechanical degradation. Insert 720' may have the identical or similar structure, including substrate 760', buffer layer 750', HTS layer 740', and cap layer 730'. In the embodiment illustrated in FIG. 7, superconductor layer 740 is shown as a high Ic(c) superconductor material and superconductor layer 740' is shown as a high Ic(ab) material, however, it is readily apparent that both superconductor layers may be high Ic(ab) material or high Ic(c) material.

Adhesive 780 bonds assembly 710 to assembly 720 at their respective substrates, creating HTS assembly 700. Cap layers 730 and 730' face outward in assembly 700, and substrates 760 and 760' are internally located in assembly 700. This configuration provides, for example, efficient electrical contact with an external current source and efficient joining of lengths of superconductor wire. The outer surfaces of the assembly are electrically conductive cap layers 730 and 730'. These layers provide convenient electrically conductive paths to respective HTS layers 740 and 740'. In order to introduce current into the HTS layers, a connection between the current source and the assembly can be made anywhere on the outer surface of the assembly.

In order to facilitate bonding between HTS assemblies 710 and 720, wetting layers, e.g., Ag or Cu, (not shown) can optionally be coated onto substrates 760 and 760'. These wetting layers facilitate the bonding of each assembly to adhesive layer 780, and therefore facilitate the bonding of each assembly to the other. In one or more embodiments, adhesive layer 780 is made of solder, a resin, epoxy, or other non-conductive material. An exemplary solder is Pb—Sn—Ag. During processing, the back surfaces of the metallic substrates (i.e. the surfaces that do not face the buffer layer) may grow a native oxide layer, which is an electrical insulator. This oxide layer typically does not wet solder, i.e. does not bond to solder. The addition of Ag wetting layers to substrates 760 and 760' makes the back surface wettable, i.e. bondable, to solder adhesive layer 780. Thus, bonding can be accomplished by soldering wetting layers that are bonded to the native oxide surfaces of the substrates.

In applications where good electrical contact between the substrates is desired, the electrically insulating native oxide layers on substrates 760 and 760' may be first removed. This removal can be done, e.g., by etching, electro-polishing, sputtering, or shot blasting. Then metallic wetting layers, e.g., Ag or Cu, are coated onto the respective back surfaces of substrates 760 and 760' to prevent the regrowth of the native oxide on the substrate surfaces. Rigorous removal of the native oxide layer is not required, however, in order to provide an HTS wire according to one or more embodiments of the present invention. Further detail on HTS assemblies for use in one or more embodiments of the present invention may be found in co-pending and commonly owned U.S. patent application Ser. No. 11/193,262, filed on Jul. 29, 2005, and entitled "Architecture For High Temperature Superconductor Wire," the context of which is incorporated in its entirety by reference.

Figure 8:
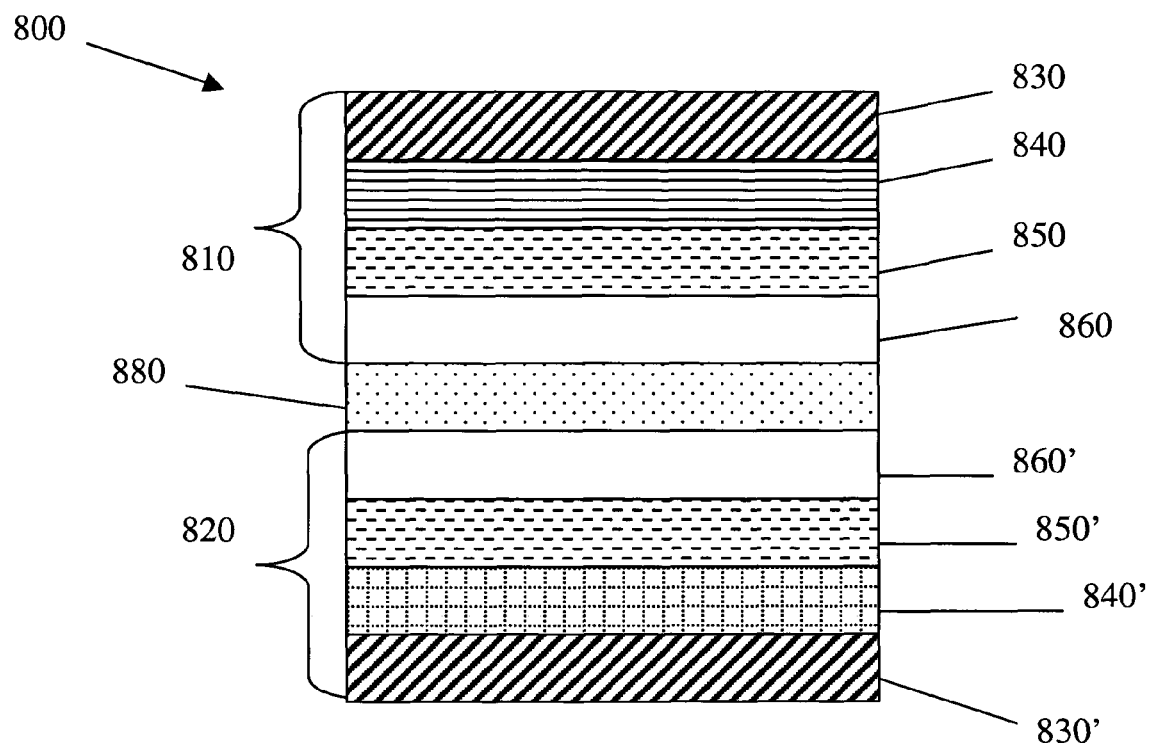
FIG. 8 is a cross-sectional illustration of a two HTS assemblies joined at their respective cap layers, in which a first assembly has a superconductor layer having high Ic(//ab) and the second assembly has a second superconducting layer having high Ic(//c).

In another embodiment of the present invention, the HTS assemblies may be joined at their respective cap layers, so that the capped superconductor layers face inward, as illustrated in FIG. 8. HTS wire 800 is made up of two HTS assemblies 810 and 820. Each of these assemblies is fabricated using techniques known in the art and is described in greater detail below. Assembly 810 includes a metal substrate 830. Substrate 830 contains at least a biaxially textured surface to provide a crystal template for buffer layer 840 and HTS layer 850. Buffer layer 840 overlays substrate 830 and may comprise one or more layers. HTS layer 850 overlays buffer layer 840 may be any HTS material. In one or more embodiments, the HTS layer includes a rare earth-alkaline earth-copper oxide, such as Y-123, that is optimized for performance at either H//ab or H//c. Cap layer 860 is located above HTS layer 850 and provides protection of the HTS layer from chemical and mechanical degradation. Insert 820 may have the identical or similar structure, including substrate 830', buffer layer 840', HTS layer 850', and cap layer 860'. In the embodiment illustrated in FIG. 8, superconductor layer 840 is shown as a high Ic(c) superconductor material and superconductor layer 840' is shown as a high Ic(ab) material, however, it is readily apparent that both superconductor layers may be high Ic(ab) material or high Ic(c) material. The individual HTS assemblies are joined at cap layers 860, 860' using one of a variety of methods. For example, exemplary joining techniques include soldering and diffusion bonding. An exemplary solder layer 880 is shown in FIG. 8 joining the two HTS assemblies 810, 820. Further information regarding HTS assemblies is found in commonly owned U.S. Pat. No. 6,828,507, which is incorporated in its entirety by reference.

Figure 9:
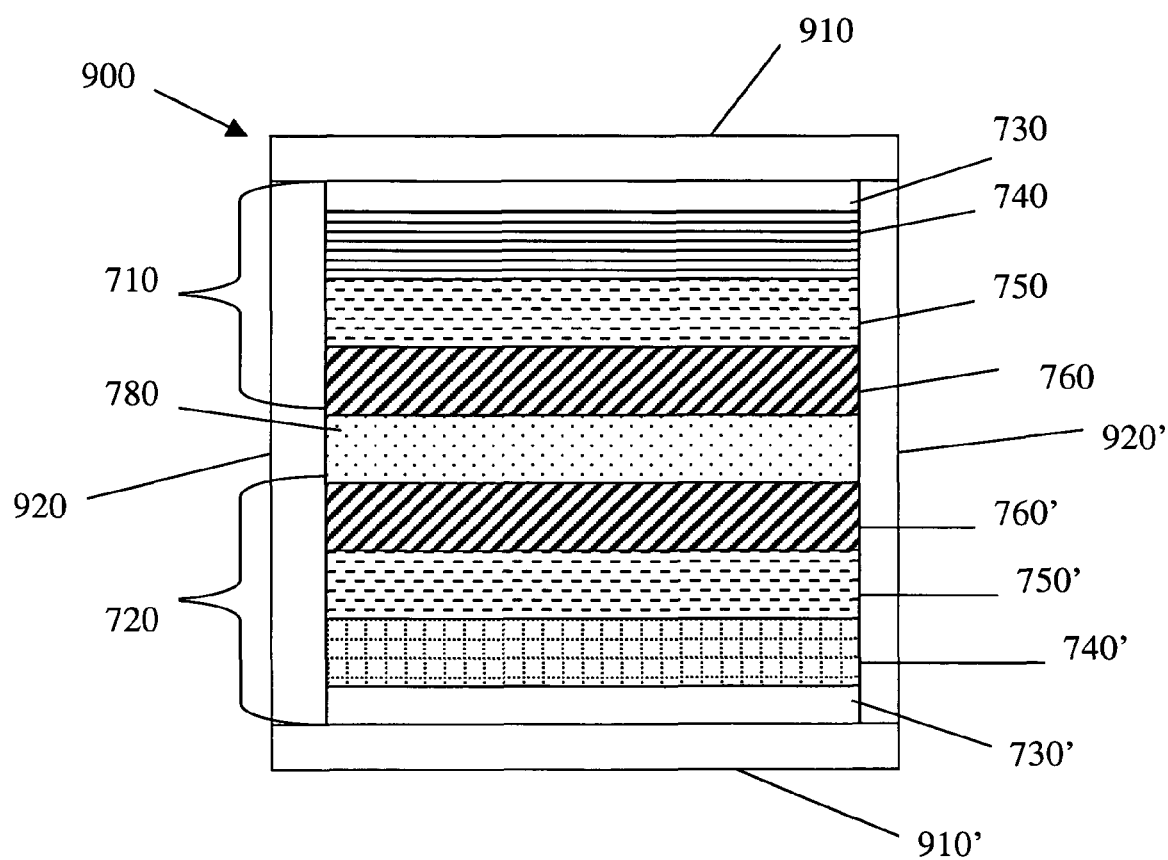
FIG. 9 is a cross-sectional illustration of two HTS assemblies joined at their respective substrates and surrounded by an electrically conductive structure.

In one or more embodiments, the electrical stability of the two superconductor layer HTS wires is further enhanced by surrounding the superconductor wire, e.g., such as the wire shown in FIGS. 7 and 8, with an electrically conductive structure 900, as is illustrated in FIG. 9. The electrically conductive structure allows current transport from one superconductor layer to another. This provides a redundant current path, thereby improving the stability of the wire to quenching and reducing the sensitivity of the wire to local defects and variations in performance. The electrically conductive structure may include upper and lower conductive strips 910, 910' in electrical contact with HTS assemblies 710 and 720. A substantially nonporous electrically conductive filler 920, 920' extends between the first and second conductive strips along the sides of the superconductor wire assembly to isolate the HTS assemblies from the environment and to provide electrical connectivity between the two superconductor layers and to an external electrical connection.

In wire 900, filler 920, 920' provides electrical communication between the HTS assemblies 710, 720. In essence filler 920, 920' behaves as a conductive conduit, or bridge. Though filler 920, 920' is conductive, as current flows through wire 900, the current will generally follow the path of least resistance, which is through one or both HTS assemblies 710, 720. The presence of redundant electrical pathways for the current improves the electrical stability of the wire and increases the current-carrying capacity of wire 900 over that of a single assembly or two isolated assemblies. Lastly, filler 920, 920' provides a means to introduce electrical current into one or both of HTS assemblies 710, 720. By simply contacting a current source to filler 920, 920', current flows via the filler into the HTS assemblies. Because filler 920, 920' is in contact with conductive stabilizer strips 910, 910', contacting a current source to one or both of strips 910, 910' also introduces current to one or both of HTS assemblies 710, 720.

Material 920, 920' is selected such that it is nonporous, has sufficient strength and is coatable to a sufficient thickness to substantially surround and seal wire 900. The thick coating of filler 920, 920' on the sides of wire 900 also adds mechanical strength to the wire and may help to prevent delamination of wire 900 due to bending or other sources of potential damage. Material 920, 920' adds thermal stability to the wire by providing additional heat capacity. In one or more embodiments, the wire has sufficient filler width to meet the mechanical strength and durability requirements of wire 900, but not much more. A typical individual filler width ranges from 0.025-0.2 mm, but can be higher or lower (e.g. 0.005-1 mm).

Stabilizer strips 910 and 910' further enhance the mechanical, electrical, and thermal stability of wire 900. Strips 910, 910' can be the same or different, depending upon the desired characteristics of the resulting wire. The thickness of the strips can be varied throughout a wide range of about 0.01-2 mm, depending upon the desired application, e.g., between 0.05-0.075 mm, to as high as or higher than 1 mm. Strips 910 and 910' are generally a flexible conductive material, e.g. metal, e.g. aluminum, copper, silver, nickel, iron, stainless steel, aluminum alloy, copper alloy, silver alloy, nickel alloy, nickel tungsten alloy, or iron alloy. For most applications, a high conductivity metal such as copper is preferred. For a fault current limiter application, a mechanically strong, high resistivity alloy such as stainless steel is preferred.

In some embodiments, stabilizer strips 910 and 910' have a width that is greater than the width of HTS assemblies 710 and 720. This excess width, or overhang, allows layers or fillets of filler 920, 920' to form along the sides of the wire by capillary action. Generally, the width of strips 910, 910' fall within the range of 0.01-2 mm greater than the width of HTS assemblies 710, 720. For example, stabilizer strips with a width of about 4.3 mm can be used with 4.0 or 4.1 mm wide superconducting inserts.

Figure 10:
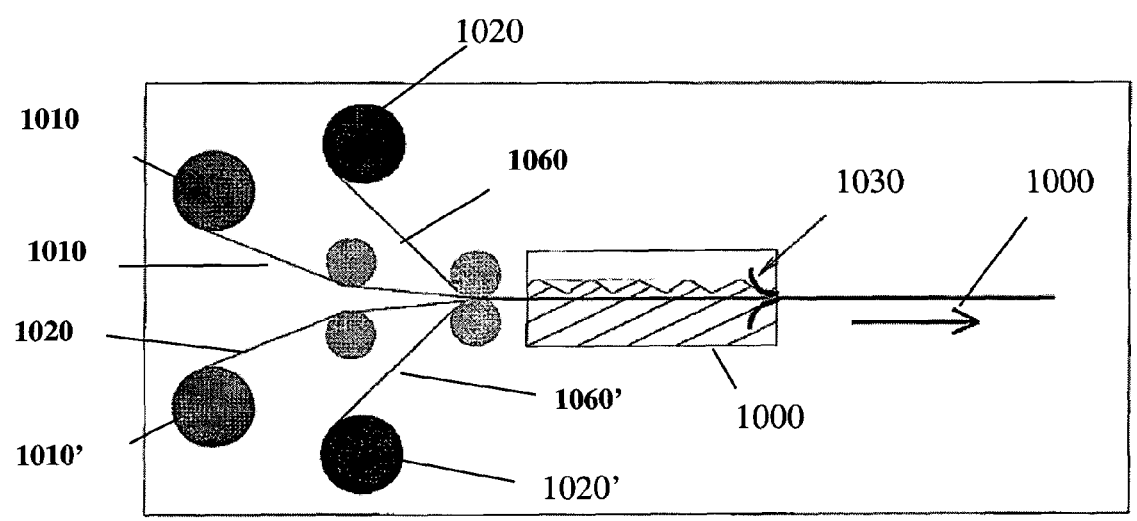
FIG. 10 is a pictorial illustration of a laminating process used to make a laminated HTS wire according to one or more embodiments of the present invention.

HTS wire, e.g., wire 1000 may be manufactured as illustrated in FIG. 10. HTS wire assemblies are fabricated as wide (e.g. about 4 to 10 cm wide) multilayer strips and then slit lengthwise into several narrow (e.g. about 10 strips of about 0.4 cm wide, from a 4 cm wide strip) strips, which form HTS assemblies 1010, 1020. See Step 1190 of FIG. 11. Conductive stabilizer strips 1060, 1060' may be wider than the width of the narrow HTS strip, so that the stabilizer strips overhang the HTS strip on both sides. After slitting, the wire is formed by joining narrow HTS insert strips 1010, 1020 with stabilizer strips 1060, 1060' in a bath 1000 of filler material. Multilayer HTS inserts 1010, 1020, for example, may be fed into the filler bath from reels 1010, 1010'. Stabilizer strips 1060, 1060' may be fed off reels 1020, 1020' placed above and below the feed-in reels 1010, 1010' of HTS 1010, 1020 so that the lengths of material form a stacked configuration. The filler simultaneously surrounds and HTS assemblies 1010, 1020 and also laminates them to the conductive stabilizer strips 1060, 1060'. Die 1030 merges and consolidates inserts 1010, 1020 and stabilizer strips 1060, 1060' into one superconducting wire 1000. By laminating the stabilizer strips to the wire after fabricating and slitting the HTS inserts, the stabilizer strips can easily be made wider than the inserts. The overhanging feature promotes the capillary wicking of the solder between the upper and lower stabilizer strips 1060, 1060' to provide thick, mechanically robust fillets of filler on the sides of the wire.

Further detail on electrically conductive structures for use with one or more embodiments of the HTS wires of the present invention may be found in co-pending and commonly owned U.S. patent application Ser. No. 11/193,262, filed on Jul. 29, 2005, and entitled "Architecture For High Temperature Superconductor Wire," the contents of which are incorporated in their entirety by reference.

Wires having different performance characteristics can be joined end-to-end to obtain an HTS wire that varies in performance along its length. This is facilitated by use of the HTS wires having an electrically conductive outer structure that provides electrical contact with the oxide superconductor layer, such as is illustrated in FIG. 9.

HTS wires such as described herein may be used in electromagnetic coils or windings. Thus, the HTS wire is wound to form a coil such that the HTS wire in the region of the coil experiencing a magnetic field with a strong H//ab component is made up of HTS wire having a high Ic(ab). Similarly, the HTS wire in the region of the coil experiencing a magnetic field with a strong H//c component is made up of HTS wire having a high Ic(c) and optionally, a desired ratio Ic(ab)/Ic(c). Regions of the coil experiencing magnetic field of intermediate orientation are made up from HTS wires having a desired combination of high Ic(ab) and high Ic(c) superconducting layers to obtain a desired Ic(c) and optionally, a desired ratio Ic(ab)/Ic(c). In addition, the thicknesses of the two layers may be selected to obtain the desired combination of current density parallel to and perpendicular to the tape surface.

Figure 11:
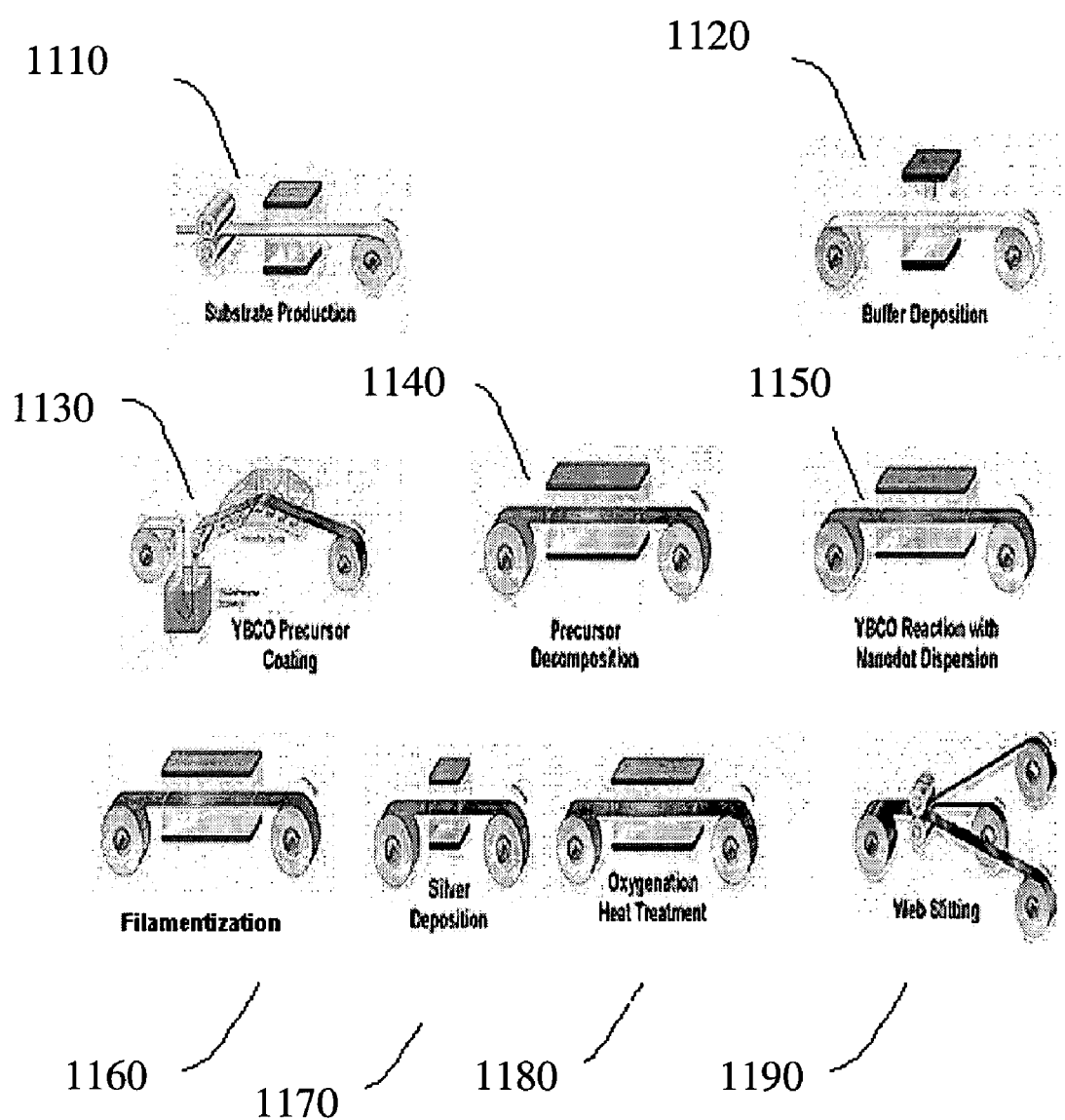
FIG. 11 illustrates a flow diagram of an exemplary process used to manufacture an HTS wire according to one or more embodiments of the present invention.

FIG. 11 illustrates a flow diagram of an exemplary process used to manufacture an HTS wire according to various embodiments of the present invention. At a first station 1110, a wire substrate is treated to obtain biaxial texture. Preferably, the substrate surface has a relatively well defined crystallographic orientation. For example, the surface can be a biaxially textured surface (e.g., a (113)[211] surface) or a cube textured surface (e.g., a (100)[011] surface or a (100)[001] surface). Preferably, the peaks in an X-ray diffraction pole figure of the surface have a FWHM of less than about 20° (e.g., less than about 15°, less than about 10°, or from about 5° to about 10°).

The surface can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline or amorphous surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material, and capable of providing the mechanical properties required for the final wire. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a wire or a wafer). In these embodiments, the substrate is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities). Ni-5 wt. % W is a preferred material for the substrate.

In certain of these embodiments, the substrate contains more than two metals (e.g., a ternary alloy or a quarternary alloy). In some of these embodiments, the alloy can contain one or more oxide formers (e.g., Mg, Al, Mo, V, Ta, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, tungsten, vanadium, aluminum, silver, iron, palladium, molybdenum, gold and zinc. In certain of these embodiments, the alloy can contain two of the following metals: copper, nickel, chromium, tungsten, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g., annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g., Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element (s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electrochemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the substrate or intermediate layer. The sulfur can be formed, for example, by exposing the intermediate layer to a gas environment containing a source of sulfur (e.g., $H_2S$, a tantalum foil or a silver foil) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one torr, less than about $1 \times 10^{-3}$ torr, less than about $1 \times^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., S c(2×2)) can be formed by applying an appropriate organic solution to the surface of the intermediate layer by heating to an appropriate temperature in an appropriate gas environment. Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

In a second processing station 1120, one or more buffer layers are formed on the textured substrate by epitaxial growth on a textured metal surface. Alternatively, a buffer layer can be formed on a polycrystalline, randomly textured metal surface using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527. In certain embodiments, solution coating processes can be used for epitaxial deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors).

Once the textured substrate including buffer layers is prepared, a precursor solution is deposited at deposition station 1130 as described above. Optionally, the precursor can be patterned. Additional equipment may be required to accomplish the patterning operation, for example, when laser ablation or ion bombardment are used to pattern the superconducting layer. If dropwise patterned deposition is used, then a single station equipped with a inkjet printer deposition apparatus can accomplish both deposition and patterning of the oxide precursor solution.

Typically, solution chemistry is used to prepare barium fluoride and/or other superconductor precursors; and a solution (e.g., a solution containing metal salts, such as yttrium acetate, yttrium trifluoroacetate (Y-TFA), copper acetate, barium acetate and/or a fluorinated salt of barium) is disposed on a surface (e.g., on a surface of a substrate, such as a substrate having an alloy layer with one or more buffer layers disposed thereon). The solution can be disposed on the surface using standard techniques (e.g., spin coating, dip coating, slot coating). The solution is dried to remove at least some of the organic compounds present in the solution (e.g., dried at about room temperature or under mild heat), and the resulting material is reacted (e.g., decomposed) in a furnace in a gas environment containing oxygen and water to form barium fluoride and/or other appropriate materials (e.g., CuO and/or $Y_2O_3$). In some embodiments, the reactors noted above can be used in any or all of these steps.

Metal salt solutions are prepared using metal sources in the appropriate proportions desired in the resulting superconductor layer. Thus, for example, an addition amount of copper salt, in excess of the stoichiometric proportions used in Y-123, is included in a precursor solution used to prepare a high Ic(ab) superconductor layer having excess copper. Similarly, the precursor solution may contain additive components, including soluble and insoluble metal compounds, that are used to modify the final superconductor composition. Such additives can include, for example, soluble compounds of metal compounds such as yttrium, neodymium, samarium, europium, gadolinium, terbium, dysprosium, holmium, erbium, thulium, ytterbium, and lutetium, alkaline earth metals, such as calcium, barium and strontium, transition metals, such as scandium, titanium, vanadium, chromium, manganese, iron, cobalt, nickel and zirconium, cerium, silver, aluminum, and magnesium that are capable of dissolving in the solvents contained in the precursor solution. Additive components may also include stoichiometric excesses of soluble compounds included in the precursor solution. For example, soluble yttrium salts or soluble copper salts may be included in the precursor solution in excess of that required to form Y123. Insoluble additive components can also be added to the precursor solution.

Examples of metal salt solutions that can be used are as follows.

In some embodiments, the metal salt solution can have a relatively small amount of free acid. In aqueous solutions, this can correspond to a metal salt solution with a relatively neutral pH (e.g., neither strongly acidic nor strongly basic). The metal salt solution can be used to prepare multi-layer superconductors using a wide variety of materials that can be used as the underlying layer on which the superconductor layer is formed.

The total free acid concentration of the metal salt solution can be less than about $1 \times 10^{-3}$ molar (e.g., less than about $1 \times 10^{-5}$ molar or about $1 \times 10^{-7}$ molar). Examples of free acids that can be contained in a metal salt solution include trifluoroacetic acid, acetic acid, nitric acid, sulfuric acid, acids of iodides, acids of bromides and acids of sulfates.

When the metal salt solution contains water, the precursor composition can have a pH of at least about 3 (e.g., at least about 5 or about 7).

In some embodiments, the metal salt solution can have a relatively low water content (e.g., less than about 50 volume percent water, less than about 35 volume percent water, less than about 25 volume percent water).

In embodiments in which the metal salt solution contains trifluoroacetate ion and an alkaline earth metal cation (e.g., barium), the total amount of trifluoroacetate ion can be selected so that the mole ratio of fluorine contained in the metal salt solution (e.g., in the form of trifluoroacetate) to the alkaline earth metal (e.g., barium ions) contained in the metal salt solution is at least about 2:1 (e.g., from about 2:1 to about 18.5:1, or from about 2:1 to about 10:1).

In general, the metal salt solution can be prepared by combining soluble compounds of a first metal (e.g., copper), a second metal (e.g., an alkaline earth metal), and a rare earth metal with one or more desired solvents and optionally water. As used herein, "soluble compounds" of the first, second and rare earth metals refer to compounds of these metals that are capable of dissolving in the solvent(s) contained in the metal salt solution. Such compounds include, for example, salts (e.g., nitrates, acetates, alkoxides, iodides, sulfates and trifluoroacetates), oxides and hydroxides of these metals.

In certain embodiments, a metal salt solution can be formed of an organic solution containing metal trifluoroacetates prepared from powders of $Ba(O_2CCH_3)_2$, $Y(O_2CCH_3)_3$, and $Cu(O_2CCH_3)_2$ which are combined and reacted using methods known to those skilled in the art. For example, the metal trifluoroacetate powders can be combined in a 2:1:3 ratio in methyl alcohol to produce a solution substantially 0.94 M based on copper content.

In certain embodiments, the metal salt solution can contain a Lewis base. The rare earth metal can be yttrium, lanthanum, europium, gadolinium, terbium, dysprosium, holmium, erbium, thulium, ytterbium, cerium, praseodymium, neodymium, promethium, samarium or lutetium. In general, the rare earth metal salt can be any rare earth metal salt that is soluble in the solvent(s) contained in the metal salt solution and that, when being processed to form an intermediate (e.g., a metal oxyhalide intermediate), forms rare earth oxide(s) (e.g., $Y_2O_3$). Such salts can have, for example, the formula $M(O_2C-(CH_2)_n-CXX'X'')(O_2C-(CH_2)_m-CX'''X''''X''''')$ $(O_2C-(CH_2)_p-CX''''''X'''''''X'''''''')$ or $M(OR)_3$. M is the rare earth metal. n, m and p are each at least one but less than a number that renders the salt insoluble in the solvent(s) (e.g., from one to ten). Each of X, X', X'', X''', X'''', X''''', X'''''', X''''''' and X'''''''' is H, F, Cl, Br or I. R is a carbon containing group, which can be halogenated (e.g., $CH_2CF_3$) or nonhalogenated. Examples of such salts include nonhalogenated carboxylates, halogenated acetates (e.g., trifluoroacetate, trichloroacetate, tribromoacetate, triiodoacetate), halogenated alkoxides, and nonhalogenated alkoxides. Examples of such nonhalogenated carboxylates include nonhalogenated acetates (e.g., $M(O_2C-CH_3)_3$). The alkaline earth metal can be barium, strontium or calcium. Generally, the alkaline earth metal salt can be any alkaline earth metal salt that is soluble in the solvent(s) contained in the metal salt solution and that, when being processed to form an intermediate (e.g., a metal oxyhalide intermediate), forms an alkaline earth halide compound (e.g., $BaF_2$, $BaCl_2$, $BaBr_2$, $BaI_2$) prior to forming alkaline earth oxide(s) (e.g., BaO). Such salts can have, for example, the formula $M'(O_2C-(CH_2)_n-CXX'X'')$ $(O_2C-(CH_2)_m-CX'''X''''X''''')$ or $M'(OR)_2$. M' is the alkaline earth metal. n and m are each at least one but less than a number that renders the salt insoluble in the solvent(s) (e.g., from one to ten). Each of X, X', X'', X''', X'''' and X''''' is H, F, Cl, B or, I. R can be a halogenated or nonhalogenated carbon containing group. Examples of such salts include halogenated acetates (e.g., trifluoroacetate, trichloroacetate, tribromoacetate, triiodoacetate). Generally, the transition metal is copper. The transition metal salt should be soluble in the solvent(s) contained in the metal salt solution. Preferably, during conversion of the precursor to the intermediate (e.g., metal oxyhalide), minimal cross-linking occurs between discrete transition metal molecules (e.g., copper molecules). Such transition metals salts can have, for example, the formula $M''(CXX'X''-CO(CH)_aCO-CX'''X''''X''''')$ $(CX''''''X'''''''X''''''''-CO(CH)_bCOCX'''''''''X''''''''''X'''''''''''),$ M"(O$_2$C—(CH$_2$)$_n$—CXX'X") (O$_2$C—(CH$_2$)$_m$—CX'''X''''X''''') or M"(OR)$_2$. M" is the transition metal. a and b are each at least one but less than a number that renders the salt insoluble in the solvent(s) (e.g., from one to five). Generally, n and m are each at least one but less than a number that renders the salt insoluble in the solvent(s) (e.g., from one to ten). Each of X, X', X", X''', X'''', X''''', X'''''', X''''''', X'''''''', X''''''''', X'''''''''' is H, F, Cl, Br or I. R is a carbon containing group, which can be halogenated (e.g., CH$_2$CF$_3$) or nonhalogenated. These salts include, for example, nonhalogenated acetates (e.g., M"(O$_2$C—CH$_3$)$_2$), halogenated acetates, halogenated alkoxides, and nonhalogenated alkoxides. Examples of such salts include copper trichloroacetate, copper tribromoacetate, copper triiodoacetate, Cu(CH$_3$COCHCOCF$_3$)$_2$, Cu(OOC$_7$H$_{15}$)$_2$, Cu(CF$_3$COCHCOF$_3$)$_2$, Cu(CH$_3$COCHCOCH$_3$)$_2$, Cu(CH$_3$CH$_2$CO$_2$CHCOCH$_3$)$_2$, CuO(C$_5$H$_6$N)$_2$ and Cu$_3$O$_3$Ba$_2$(O—CH$_2$CF$_3$)$_4$. In certain embodiments, the transition metal salt is a carboxylate salt (e.g., a nonhalogenated carboxylate salt), such as a propionate salt of the transition metal (e.g., a nonhalogenated propionate salt of the transition metal). An example of a nonhalogenated propionate salt of a transition metal is Cu(O$_2$CC$_2$H$_5$)$_2$. In some embodiments, the transition metal salt is a simple salt, such as copper sulfate, copper nitrate, copper iodide and/or copper oxylate. In some embodiments, n and/or m can have the value zero. In certain embodiments, a and/or b can have the value zero. An illustrative and nonlimiting list of Lewis bases includes nitrogen-containing compounds, such as ammonia and amines. Examples of amines include CH$_3$CN, C$_5$H$_5$N and R$_1$R$_2$R$_3$N. Each of R$_1$, R$_2$, R$_3$ is independently H, an alkyl group (e.g., a straight chained alkyl group, a branched alkyl group, an aliphatic alkyl group, a non-aliphatic alkyl group and/or a substituted alkyl group) or the like. Without wishing to be bound by theory, it is believed that the presence of a Lewis base in the metal salt solution can reduce cross-linking of copper during intermediate formation. It is believed that this is achieved because a Lewis base can coordinate (e.g., selective coordinate) with copper ions, thereby reducing the ability of copper to cross-link.

Typically, the metal salt solution is applied to a surface (e.g., a buffer layer surface), such as by spin coating, dip coating, web coating, slot coating, gravure coating, or other techniques known to those skilled in the art, and subsequently heated.

At a subsequent station 1140, the precursor components are decomposed. In the case of precursor components including at least one fluoride-containing salt, the first step of the heating step is performed to decompose the metalorganic molecules to one or more oxyfluoride intermediates of the desired superconductor material.

Typically, the initial temperature in this step is about room temperature, and the final temperature is from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute. During this step, the partial pressure of water vapor in the nominal gas environment is preferably maintained at from about 5 Torr to about 50 Torr, more preferably at from about 5 Torr to about 30 Torr, and most preferably at from about 20 Torr to about 30 Torr. The partial pressure of oxygen in the nominal gas environment is maintained at from about 0.1 Torr to about 760 Torr and preferably at about 730-740 Torr.

Heating is then continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating is further continued to a temperature of about 650° C., or more preferably to a temperature of about 400° C., to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. In these embodiments, heating is then continued to a temperature of from about 220° C. to about 290° C. (e.g., about 220° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form barium fluoride. The nominal partial pressure of oxygen can be, for example, from about 0.1 Torr to about 760 Torr.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 Torr, a predetermined partial pressure of water vapor (e.g. at least about 10 Torr, at least about 15 Torr, at most about 25 Torr, at most about 20 Torr, about 17 Torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

Additional layers can be deposited over a previously deposited layer, which have been processed to form an oxyfluoride intermediate film. Processing conditions are substantially as described herein above; however, the partial pressure of water vapor during decomposition to the oxyfluoride film is about 5-10 torr.

The foregoing treatments of a metal salt solution can result in an oxyfluoride intermediate film in which the constituent metal oxides and metal fluorides are homogeneously distributed throughout the film. Preferably, the precursor has a relatively low defect density and is essentially free of cracks through the intermediate thickness. While solution chemistry for barium fluoride formation has been disclosed, other methods can also be used for other precursor solutions.

The superconductor intermediate film can then be heated to form the desired HTS layer at a further processing station 1150. Typically, this step is performed by heating from about room temperature to a temperature of from about 700° C. to about 825° C., preferably to a temperature of about 740° C. to 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the intermediate oxyfluoride film. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then held at a temperature of about 700° C.-825° C., preferably to a temperature of about 740° C. to 800° C. and more preferably to a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then cooled to room temperature in a nominal gas environment with an oxygen pressure of about 0.05 Torr to about 150 Torr, preferably about 0.1 Torr to about 0.5 Torr and more preferably from about 0.1 Torr to about 0.2 Torr.

Treatment of precursor films as described above provide a superconductor oxide film of normal 123YBC stoichiometry. Stoichiometry my vary if the precursor composition contains, for example, additives for the formation of second phase precipitates for the formation of nanoscale pinning sites.

Optionally, filamentization can be performed at station 1160 by known processes, or by processes described in U.S. patent application Ser. No. 10/955,801, filed on Sep. 29, 2004. Further processing by noble metal deposition at station 1170, oxygen annealing in a high oxygen environment, e.g., 760 torr $O_2$, at station 1180, lamination as described herein above and slitting at station 1190 complete the process.

The invention is described with reference to the following examples, which are presented for the purpose of illustration and are in no way intended to be limiting of the invention.

EXAMPLE 1

Preparation of a High Ic(ab) Superconducting Layer

A Y-123 precursor solution having a stoichiometry of Y:Ba:Cu of 1:2:3.34 was prepared by dissolving about 0.83 grams of $Y(CF_3CO_2)_3$, about 1.60 grams of $Ba(CF_3CO_2)_2$ and about 1.54 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

The precursor solution was deposited by a spin coating technique, at a speed of 2000 RPM, on a length (20 cm to 10 meter) of 1 cm wide biaxially textured oxide buffered metallic substrate with the structure Ni(5 at %)W/$Y_2O_3$/YSZ/$CeO_2$. A sufficient quantity of precursor solution was deposited to produce about a 0.8 μm thick $YBa_2Cu_3O_{7-x}$ film.

The coated sample was decomposed to an intermediate metal oxyfluoride film by heating, in a 2.25" diameter tube furnace, from room temperature to about 200° C. at a rate of about 15° C. per minute, then from about 200° C. to about 250 C at a rate of about 0.9° C. per minute and then from about 250° C. to about 400° C. at a rate of about 5° C. per minute in a flowing gas environment having a total gas pressure of about 760 torr (water vapor pressure of about 24 torr and balance oxygen).

The metal oxyfluoride film was then heat treated to form an oxide superconductor. A short length (1-2 cm) of the intermediate film was heated in a tube furnace to about 785° C. at a rate of about 200° C. per minute and held for about 30 min in an environment having a total gas pressure of about 240 mtorr (water vapor pressure of about 90 mtorr, and oxygen gas pressure of about 150 mtorr). After 30 min holding, the $H_2O$ vapor removed from the gas environment and the film was then cooled to room temperature in about 150 mtorr $O_2$. The resulting film and was about 0.8 micron thick.

EXAMPLE 2

Preparation of a High Ic(c) Superconductor Layer
Using 50 Mol % Excess Er-Y123

A precursor solution was prepared by dissolving about 0.83 grams of $Y(CF_3CO_2)_3$, about 0.138 grams of $Er(CH_3CO_2)_3$, about 1.60 grams of $Ba(CF_3CO_2)_2$ and about 1.28 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

The precursor was coated, decomposed, processed and Ag coated as described in Example 1. The resulting film had a smooth and shiny surface, and surprisingly higher thickness of about 2.6 micron with a single coating. The x-ray diffraction pattern of the final film showed the presence of was (001) textured Y(Er)Ba$_2$Cu$_3$O$_{7-x}$.

EXAMPLE 3

Preparation of Double Coated Superconducting Layers with Different Compositions

A baseline YBCO precursor solution having a stoichiometry of Y:Ba:Cu of 1:2:3.23 was prepared by dissolving about 0.85 grams Y(CF$_3$CO$_2$)$_3$, about 1.45 grams of Ba(CF$_3$CO$_2$)$_2$ and about 1.35 grams of Cu(C$_2$H$_5$CO$_2$)$_2$ in about 4.85 ml of methanol (CH$_3$OH) and about 0.15 ml of propionic acid (C$_2$H$_6$CO$_2$). The final volume of the solution was adjusted with methanol to have a Y concentration of approximately 0.4 molar.

A YBCO precursor solution with 50% Dysprosium addition having a stoichiometry of Y:Dy:Ba:Cu of 1:0.5:2:3.23 was prepared by dissolving about 1.70 grams Dy(CH$_3$CO$_2$)$_3$, and about 1.90 ml of methanol (CH$_3$OH) in about 20 ml of baseline solution. The final volume of the solution was adjusted with methanol to have a Y concentration of approximately 0.3 molar.

The 50% Dy added precursor solution was deposited on a biaxially textured oxide buffered metallic substrate with the structure Ni(5 at %)W/Y$_2$O$_3$/YSZ/CeO$_2$ by slot die coating technique. The solution was coated on the buffered substrate with the amount targeted to form a 0.8 μm thick REBa$_2$Cu$_3$O$_{7-x}$ film.

The coated sample was decomposed to an intermediate metal oxyfluoride film by heating, in a 2.25" diameter tube furnace, from room temperature to about 200° C. at a rate of about 15° C. per minute, then from about 200° C. to about 250 C at a rate of about 0.9° C. per minute and then from about 250° C. to about 400° C. at a rate of about 5° C. per minute in a flowing gas environment having a total gas pressure of about 760 torr (water vapor pressure of about 17.5 torr and balance oxygen) 20° C.

The metal oxyfluoride film was then coated with baseline YBCO precursor solution prepared as described earlier with target final thickness of 0.6 μm YBa$_2$Cu$_3$O$_x$.

The coated tape was decomposed again to form the intermediate metal oxyfluoride by the same process as mentioned earlier except this time the H$_2$O vapor pressure was controlled to about 9.2 torr.

The decomposed tape was heat treated to form an oxide superconductor. The tape was joined with 4 m of similarly coated NiW leader tape both in front and in the back to establish the uniform and control environment during the reaction. The tape was then reacted at 785° C. with the following parameters. The tape was ramped up to 785° C. with average ramp rate of about 285° C./min. During reaction, the total pressure during reaction was controlled to about 1 torr. The H$_2$O partial pressure was about 800 mtorr and oxygen partial pressure was about 200 mtorr. The reaction time was about 11 min. During cooling, a total pressure of about 1 torr was used with oxygen partial pressure at about 200 mtorr and N$_2$ partial pressure at about 800 mtorr.

Figure 12:
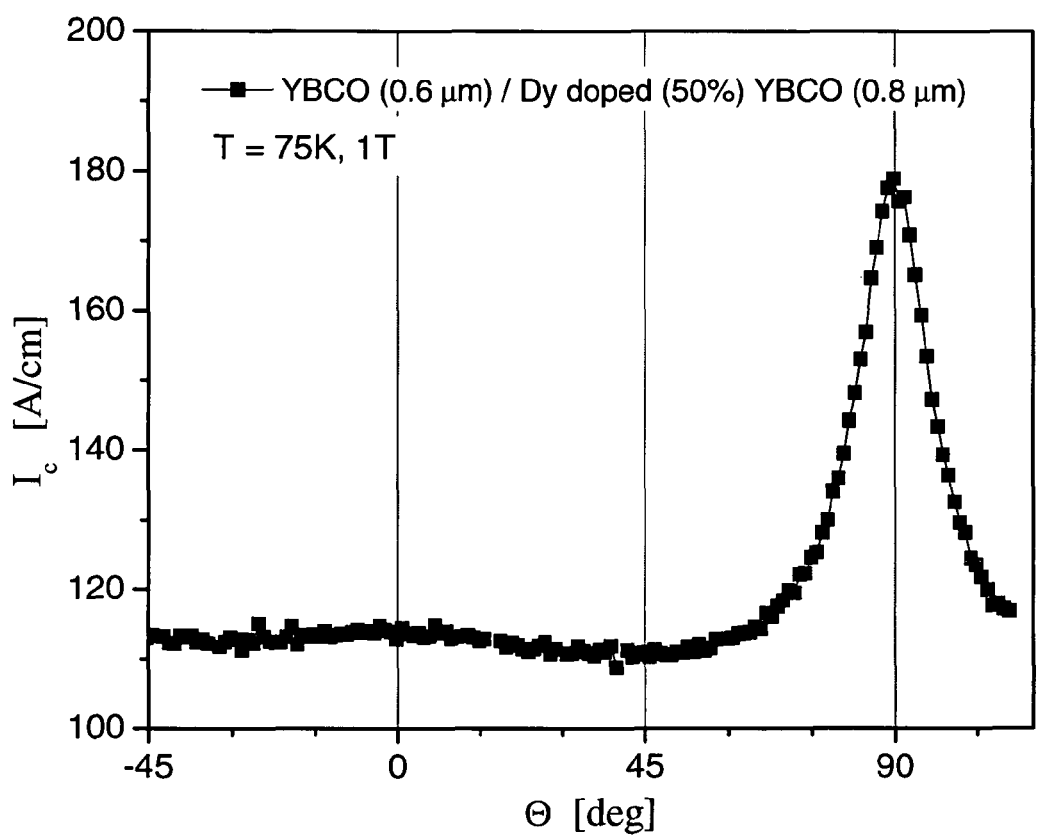
FIG. 12 is a plot of the critical current (Ic) versus magnetic field orientation ($\ominus$) at 77 K and 1 Tesla of the HTS wire described in Example 3.

The reacted film was coated with ~3 μm of Ag protection layer and then annealed in 760 torr oxygen environment. The resulting film carried I$_c$ of about ~500/cm-width or a Jc of about 4 MA/cm$^2$ at 77K, self field. The critical current (Ic) versus magnetic field orientation (Θ) at 75K and 1 Tesla is plotted in FIG. 12. At 75 K and 1 Tesla, the HTS wire carries Ic of 114 A/cm-width and 178 A/cm-width with the field perpendicular and parallel to the sample surface, respectively. This represents an anisotropy of about 1.5.

INCORPORATION BY REFERENCE

The following documents are hereby incorporated by reference: U.S. Pat. No. 5,231,074, issued on Jul. 27, 1993, and entitled "Preparation of Highly Textured Oxide Superconducting Films from MOD Precursor Solutions;" U.S. Pat. No. 6,022,832, issued Feb. 8, 2000, and entitled "Low Vacuum Process for Producing Superconductor Articles with Epitaxial Layers;" U.S. Pat. No. 6,027,564, issued Feb. 22, 2000, and entitled "Low Vacuum Process for Producing Epitaxial Layers;" U.S. Pat. No. 6,190,752, issued Feb. 20, 2001, and entitled "Thin Films Having Rock-Salt-Like Structure Deposited on Amorphous Surfaces;" PCT Publication No. WO 00/58530, published on Oct. 5, 2000, and entitled "Alloy Materials;" PCT Publication No. WO/58044, published on Oct. 5, 2000, and entitled "Alloy Materials;" PCT Publication No. WO 99/17307, published on Apr. 8, 1999, and entitled "Substrates with Improved Oxidation Resistance;" PCT Publication No. WO 99/16941, published on Apr. 8, 1999, and entitled "Substrates for Superconductors;" PCT Publication No. WO 98/58415, published on Dec. 23, 1998, and entitled "Controlled Conversion of Metal Oxyfluorides into Superconducting Oxides;" PCT Publication No. WO 01/11428, published on Feb. 15, 2001, and entitled "Multi-Layer Articles and Methods of Making Same;" PCT Publication No. WO 01/08232, published on Feb. 1, 2001, and entitled "Multi-Layer Articles And Methods Of Making Same;" PCT Publication No. WO 01/08235, published on Feb. 1, 2001, and entitled "Methods And Compositions For Making A Multi-Layer Article;" PCT Publication No. WO 01/08236, published on Feb. 1, 2001, and entitled "Coated Conductor Thick Film Precursor;" PCT Publication No. WO 01/08169, published on Feb. 1, 2001, and entitled "Coated Conductors With Reduced A.C. Loss;" PCT Publication No. WO 01/15245, published on Mar. 1, 2001, and entitled "Surface Control Alloy Substrates and Methods of Manufacture Therefor;" PCT Publication No. WO 01/08170, published on Feb. 1, 2001, and entitled "Enhanced Purity Oxide Layer Formation;" PCT Publication No. WO 01/26164, published on Apr. 12, 2001, and entitled "Control of Oxide Layer Reaction Rates;" PCT Publication No. WO 01/26165, published on Apr. 12, 2001, and entitled "Oxide Layer Method;" PCT Publication No. WO 01/08233, published on Feb. 1, 2001, and entitled "Enhanced High Temperature Coated Superconductors;" PCT Publication No. WO 01/08231, published on Feb. 1, 2001, and entitled "Methods of Making A Superconductor;" PCT Publication No. WO 02/35615, published on Apr. 20, 2002, and entitled "Precursor Solutions and Methods of Using Same;" U.S. Pat. No. 6,436,317, issued on Aug. 20, 2002, and entitled, "Oxide Bronze Compositions and Textured Articles Manufactured in Accordance Therewith;" U.S. Provisional Patent Application No. 60/309,116, filed on Jul. 31, 2001, and entitled "Multi-Layer Superconductors and Methods of Making Same;" U.S. Pat. No. 6,797,313, issued on Sep. 28, 2004, and entitled "Superconductor Methods and Reactor;" U.S. Provisional Patent Application No. 60/166, 297, filed on Nov. 18, 1999, and entitled "Superconductor Articles and Compositions and Methods for Making Same;" and commonly owned U.S. Pat. No. 6,974,501, issued on Dec. 13, 2005, and entitled "Superconductor Articles and Compositions and Methods for Making Same;" U.S. Patent Publication No. 2005-0065035, published Mar. 24, 2005, and entitled "Superconductor Methods and Reactors;" U.S. Patent Publication No. 2006-0040830, published on Feb. 23, 2006, and entitled "Low AC Loss Filamentary Coated Superconductors;" U.S. patent application Ser. No. 10/955,801, filed on Sep. 29, 2004, and entitled "Stacked Filamentary Superconductors;" U.S. Patent Application (number not yet assigned), filed on Jul. 21, 2006, and entitled "Fabrication of Sealed High Temperature Superconductor Wires;" U.S. Provisional Patent Application (number not yet assigned), filed on Jul. 21, 2006, and entitled "High Current, Compact Flexible Conductors Containing High Temperature Superconducting Tapes;" U.S. Provisional Patent Application (number not yet assigned), filed on Jul. 21, 2006, and entitled "Low Resistance Splice for High Temperature Superconductor Wires;" and U.S. Provisional Patent Application (number not yet assigned), filed Jul. 24, 2006, and entitled "High Temperature Superconductors Having Planar Magnetic Flux Pinning Centers and Methods for Making the Same," all of which are hereby incorporated by reference.

Other embodiments are within the following claims.

What is claimed is:

1. A superconducting wire, comprising:
at least first and second superconducting layers disposed on one or more substrates in stacked relationship,
the first superconducting layer comprising a first high temperature superconducting oxide selected to provide a first predetermined ratio of critical current in a magnetic field parallel to the surface of the superconductor layer to critical current in a magnetic field perpendicular to the surface of the superconductor layer (Ic(ab)/Ic(c)), and
the second superconducting layer comprising a second high temperature superconducting layer selected to provide a second predetermined ratio of critical current in a magnetic field parallel to the surface of the superconductor layer to critical current in a magnetic field perpendicular to the surface of the superconductor layer (Ic(ab)/Ic(c)),
wherein the first and second superconductor layers, in combination, provide a predetermined overall critical current Ic in a selected magnetic field orientation and wherein the first superconducting layer is selected to provide a higher critical current Ic(c) in a magnetic field perpendicular to the surface of the superconducting layer than the second superconducting wire and the second superconducting layer is selected to provide a higher critical current Ic(c) in a magnetic field parallel to the surface of the superconducting layer than the first superconducting wire.

2. The superconductor wire of claim 1, wherein the first predetermined ratio for Ic(ab)/Ic(c) is less than or equal to 2.6 in an applied magnetic field of 1 Tesla or greater.

3. The superconductor wire of claim 1, wherein the first predetermined ratio for Ic(ab)/Ic(c) is less than 2.0 in an applied magnetic field of 1 Tesla or greater.

4. The superconductor wire of claim 1, wherein the first predetermined ratio for Ic(ab)/Ic(c) is less than 1.5 in an applied magnetic field of 1 Tesla or greater.

5. The superconductor wire of claim 2, 3, or 4, wherein the applied magnetic field is in the range of about 1 Tesla to about 6 Tesla.

6. The superconductor wire of claim 1, wherein the high temperature superconductor comprises a rare earth-alkaline earth-copper oxide, wherein the rare earth comprises two or more rare earth elements.

7. The superconductor of claim 6, wherein the rare earth-alkaline earth-copper oxide comprises yttrium in excess of the amount needed for a stoichiometric rare earth alkaline earth-copper.

8. The superconductor wire of claim 6, wherein the rare earth element comprises one or more of erbium and holmium.

9. The superconductor wire of claim 8, wherein the one or more of holmium and erbium is present in an amount in the range of 25% to 150% of the stoichiometric amount of rare earth in rare earth-alkaline earth-copper oxide.

10. The superconductor wire of claim 9, wherein the rare earth element further comprises yttrium.

11. The superconductor wire of claim 1, wherein the high temperature superconductor comprises a rare earth-alkaline earth-copper oxide and at least one second phase nanoparticle comprising a metal-containing compound located within a grain of the oxide superconductor.

12. The superconductor wire of claim 11, wherein the second phase nanoparticle comprises one or more of a rare earth element, an alkaline earth metal, and a transition metal.

13. The superconductor wire of claim 11, wherein the second phase nanoparticle is selected from the group consisting of zirconium oxide, aluminum oxide, $Y_2Cu_2O_5$, $Y_2BaCuO_4$, magnesium oxide, $BaZrO_3$, silver and $CeO_2$.

14. The superconductor wire of claim 1, wherein the second predetermined ratio for Ic(ab)/Ic(c) is greater than 2.5 in an applied magnetic field of 1 Tesla or greater.

15. The superconductor wire of claim 1, wherein the second predetermined ratio for Ic(ab)/Ic(c) is greater than 3.5 in an applied magnetic field of 1 Tesla or greater.

16. The superconductor wire of claim 1, wherein the second predetermined ratio for Ic(ab)/Ic(c) is greater than 5.5 in an applied magnetic field of 1 Tesla or greater.

17. The superconductor wire of claim 14, 15, or 16, wherein the applied magnetic field is in the range of about 1 Tesla to about 6 Tesla.

18. The superconductor wire of claim 1, wherein the high temperature superconductor comprises a rare earth-alkaline earth-copper oxide, wherein the copper to alkaline earth ratio is greater than 1.5.

19. The superconductor wire of claim 1, wherein the thicknesses of the first and second superconductor layers are different.

20. The superconductor wire of claim 1, wherein the thickness of the first and second superconductor layers are selected to provide a predetermined overall critical current in a selected magnetic field orientation.

21. The superconductor wire of claim 1, wherein the selected magnetic field orientation is between 0° (H//c) and 90° (H//ab).

22. The superconducting wire of claim 1, wherein the first superconducting layer is disposed on an upper surface of the substrate, and the second superconducting layer is disposed on a lower surface of the substrate.

23. The superconducting wire of claim 22, wherein at least one first buffer layer is disposed between the upper surface of the substrate and the first superconducting layer, and at least one second buffer layer is disposed between the lower surface of the substrate and the second superconducting layer.

24. The superconducting wire of claim 1, wherein the second superconductor layer overlays the first superconductor layer.

25. The superconducting wire of claim 24, wherein a conducting layer is disposed between the first and second superconducting layers.

26. The superconducting wire of claim 25, wherein the conducting layer comprises copper.

27. The superconducting wire of claim 24, wherein one or more buffer layers is disposed between the substrate and the first superconducting layer.

28. The superconductor wire of claim 1, wherein the wire further comprises:
- a first coated element comprising:
  - a first substrate;
  - at least one first buffer layer disposed on the first substrate and supporting the first superconducting layer; and
  - a first metallic protective layer disposed on the first superconductor layer; and
- a second coated element comprising:
  - a second substrate;
  - at least one second buffer layer disposed on the second substrate and supporting the second superconducting layer; and
  - a second metallic protective layer disposed on the second superconductor layer.

29. The superconducting wire of claim 28, further comprising:
- an intervening binder layer disposed between the first and second coated elements such that the first and second coated elements are joined at the first and second substrates.

30. The superconducting wire of claim 29, further comprising:
- an intervening binder layer disposed between the first and second coated elements such that the first and second coated elements are joined at the first and second metallic protective layers.

* * * * *